(12) United States Patent
Toyoda et al.

(10) Patent No.: US 9,837,395 B2
(45) Date of Patent: Dec. 5, 2017

(54) SEMICONDUCTOR DEVICE

(71) Applicant: Renesas Electronics Corporation, Tokyo (JP)

(72) Inventors: Hisashi Toyoda, Tokyo (JP); Koichi Yamazaki, Tokyo (JP); Koichi Arai, Ibaraki (JP); Tatsuhiro Seki, Tokyo (JP)

(73) Assignee: Renesas Electrics Corporation, Tokyo (JE)

( * ) Notice: Subject to any disclaimer, the term of this patent is extended or adjusted under 35 U.S.C. 154(b) by 0 days.

(21) Appl. No.: 15/097,128

(22) Filed: Apr. 12, 2016

(65) Prior Publication Data

US 2016/0315075 A1    Oct. 27, 2016

(30) Foreign Application Priority Data

Apr. 22, 2015    (JP) .................. 2015-087671

(51) Int. Cl.
*H01L 29/15*    (2006.01)
*H01L 31/0312*    (2006.01)
(Continued)

(52) U.S. Cl.
CPC .............. *H01L 25/18* (2013.01); *H01L 24/49* (2013.01); *H01L 25/072* (2013.01); *H01L 29/1095* (2013.01); *H02P 27/06* (2013.01); *H03K 17/102* (2013.01); *H03K 17/6871* (2013.01); *H03K 17/74* (2013.01); *H01L 2224/0603* (2013.01); *H01L 2224/48137* (2013.01); *H01L 2224/48225* (2013.01); *H01L 2224/49113* (2013.01); *H01L 2924/00014* (2013.01); *H01L 2924/10253* (2013.01); *H01L 2924/10272* (2013.01);
(Continued)

(58) Field of Classification Search
None
See application file for complete search history.

(56) References Cited

U.S. PATENT DOCUMENTS 7,019,344 B2* 3/2006 Singh .................. H01L 29/7825
257/263
7,105,875 B2* 9/2006 Singh .................. H01L 27/0814
257/220

(Continued)

FOREIGN PATENT DOCUMENTS

DE    10 2006 029 928 B3    9/2007
JP          5012930 B2    8/2012
(Continued)

OTHER PUBLICATIONS

Extended European Search Report dated Aug. 30, 2016.

*Primary Examiner* — Telly Green
(74) *Attorney, Agent, or Firm* — McGinn IP Law Group, PLLC

(57) ABSTRACT

A semiconductor device includes a normally-on junction FET having a gate electrode, a source electrode and a drain electrode and a normally-off MOSFET having a gate electrode, a source electrode and a drain electrode. The source electrode of the junction FET is electrically connected to the drain electrode of the MOSFET, and the junction FET is thus connected to the MOSFET in series. The gate electrode of the junction FET is electrically connected to the gate electrode of the MOSFET.

18 Claims, 19 Drawing Sheets

(51) Int. Cl.

| | | |
|---|---|---|
| *H01L 25/18* | (2006.01) | |
| *H03K 17/10* | (2006.01) | |
| *H03K 17/687* | (2006.01) | |
| *H03K 17/74* | (2006.01) | |
| *H01L 23/00* | (2006.01) | |
| *H01L 25/07* | (2006.01) | |
| *H01L 29/10* | (2006.01) | |
| *H02P 27/06* | (2006.01) | |

(52) U.S. Cl.
 CPC ........... *H01L 2924/1203* (2013.01); *H01L 2924/1207* (2013.01); *H01L 2924/13062* (2013.01); *H01L 2924/13091* (2013.01); *H03K 2017/6875* (2013.01)

(56) References Cited

U.S. PATENT DOCUMENTS

| | | | | |
|---|---|---|---|---|
| 7,205,629 B2* | 4/2007 | Singh | ......... | H01L 29/1066 257/122 |
| 7,282,760 B2* | 10/2007 | Hoshino | ......... | H01L 29/0634 257/302 |
| 7,449,762 B1* | 11/2008 | Singh | ......... | H01L 29/66522 257/279 |
| 7,750,377 B2* | 7/2010 | Hoshino | ......... | H01L 29/0634 257/263 |
| 8,013,430 B2* | 9/2011 | Satou | ......... | H01L 23/49575 257/676 |
| 8,017,978 B2* | 9/2011 | Lidow | ......... | H01L 25/18 257/103 |
| 8,084,812 B2* | 12/2011 | Kitamura | ......... | H01L 29/66666 257/329 |
| 8,124,469 B2* | 2/2012 | Acharya | ......... | H01L 27/0207 257/E21.641 |
| 8,368,120 B2* | 2/2013 | Lidow | ......... | H01L 25/18 257/191 |
| 8,766,375 B2* | 7/2014 | Bramian | ......... | H03K 17/107 257/392 |
| 8,785,987 B2* | 7/2014 | Masliah | ......... | H01L 29/402 257/213 |
| 8,847,235 B2* | 9/2014 | Rose | ......... | H03K 17/08122 257/76 |
| 8,872,191 B2* | 10/2014 | Shimizu | ......... | H01L 21/8213 257/77 |
| 9,362,905 B2* | 6/2016 | Zhang | ......... | H03K 17/107 |
| 9,400,513 B2* | 7/2016 | Mauder | ......... | G05F 1/46 |
| 2001/0024138 A1 | 9/2001 | Dohnke et al. | | |
| 2007/0278525 A1* | 12/2007 | Acharya | ......... | H01L 27/0207 257/204 |
| 2010/0141229 A1* | 6/2010 | Satou | ......... | H01L 23/49575 323/282 |
| 2011/0045645 A1* | 2/2011 | Acharya | ......... | H01L 27/0207 438/210 |
| 2011/0199148 A1 | 8/2011 | Iwamura | | |
| 2011/0273154 A1* | 11/2011 | Satou | ......... | H01L 23/49575 323/282 |
| 2012/0262220 A1 | 10/2012 | Springett | | |
| 2013/0335134 A1 | 12/2013 | Kanazawa et al. | | |
| 2014/0049296 A1 | 2/2014 | Jeon et al. | | |

FOREIGN PATENT DOCUMENTS

| | | |
|---|---|---|
| JP | 2014-003110 A | 1/2014 |
| JP | 2014-512765 A | 5/2014 |

* cited by examiner

SEMICONDUCTOR DEVICE

CROSS-REFERENCE TO RELATED APPLICATION

The present application claims priority from Japanese Patent Application No. 2015-087671 filed on Apr. 22, 2015, the content of which is hereby incorporated by reference into this application.

TECHNICAL FIELD OF THE INVENTION

The present invention relates to a semiconductor device, and can be effectively applied to, for example, a power semiconductor device and a system using the power semiconductor device.

BACKGROUND OF THE INVENTION

A switching element made up of a field effect transistor (FET) with high operating voltage and being able to pass a large current, that is, a so-called power transistor has been widely used in, for example, power sources of an information device, home electronics and an in-vehicle device and a motor-drive device.

A switching element using a cascode connection has been known as the switching element mentioned above. The switching element using a cascode connection includes, for example, a normally-on junction field effect transistor (JFET) and a normally-off metal oxide semiconductor field effect transistor (MOSFET), and the normally-on junction FET and the normally-off MOSFET are connected in series.

In the technique disclosed in Japanese Patent Application Laid-Open Publication No. 2014-512765 (Patent Document 1), a switch has a first normally-on semiconductor device and a first normally-off semiconductor device, and a source of the first normally-on semiconductor device is connected to a drain of the first normally-off semiconductor device.

In the technique disclosed in Japanese Patent No. 5012930 (Patent Document 2), a hybrid power device has a normally-on SiC-JFET and a normally-off Si-MOSFET, and a source of the SiC-JFET and a drain of the Si-MOSFET are connected, so that the SiC-JFET and the Si-MOSFET are cascode-connected.

In the technique disclosed in Japanese Patent Application Laid-Open Publication No. 2014-3110 (Patent Document 3), a semiconductor device has a normally-off silicon transistor and a normally-on compound transistor whose source-drain path is coupled between a pair of terminals through a source-drain path of the silicon transistor.

SUMMARY OF THE INVENTION

When a junction FET is a normally-on junction FET, charge carrier flows from a source layer to a drain region through a part of a drift layer adjacent to a gate layer even when the junction FET is in an on-state. However, when a voltage applied to the gate layer of the junction FET is 0 V, a depletion layer is likely to be formed in the part of the drift layer adjacent to the gate layer in the junction FET. Accordingly, a width of the part of the drift layer through which the charge carrier can flow, that is, a so-called effective source width is narrowed, and the on-resistance of the junction FET is increased.

Meanwhile, when an interval between adjacent two gate layers is widened in order to reduce the on-resistance of the junction FET, the withstand voltage of the junction FET is decreased. As described above, it is difficult to achieve both of the improvement of the withstand voltage and the reduction of the on-resistance in the junction FET. Therefore, it is difficult to achieve both of the improvement of the withstand voltage and the reduction of the on-resistance also in the semiconductor device having a junction FET and a MOSFET in cascode connection, and it is not possible to improve the characteristics of the semiconductor device.

The other problems and novel characteristics of the present invention will be apparent from the description of the present specification and the accompanying drawings.

According to an embodiment, a semiconductor device includes a normally-on junction FET and a normally-off MOSFET. A source electrode of the junction FET is electrically connected to a drain electrode of the MOSFET, and the junction FET is thus connected to the MOSFET in series. A gate electrode of the junction FET is electrically connected to a gate electrode of the MOSFET.

According to another embodiment, a semiconductor device includes a normally-on junction FET, a normally-off MOSFET and a voltage applying unit which applies a voltage to a gate electrode of the junction FET. A source electrode of the junction FET is electrically connected to a drain electrode of the MOSFET, and the junction FET is thus connected to the MOSFET in series. The voltage applying unit applies a voltage with a polarity opposite to that of a voltage applied to the gate electrode of the junction FET when the junction FET is brought into an off-state, to the gate electrode of the junction FET when the MOSFET is in an on-state.

According to an embodiment, it is possible to improve the performance of the semiconductor device.

BRIEF DESCRIPTIONS OF THE DRAWINGS

DESCRIPTIONS OF THE PREFERRED EMBODIMENTS

Figure 1:
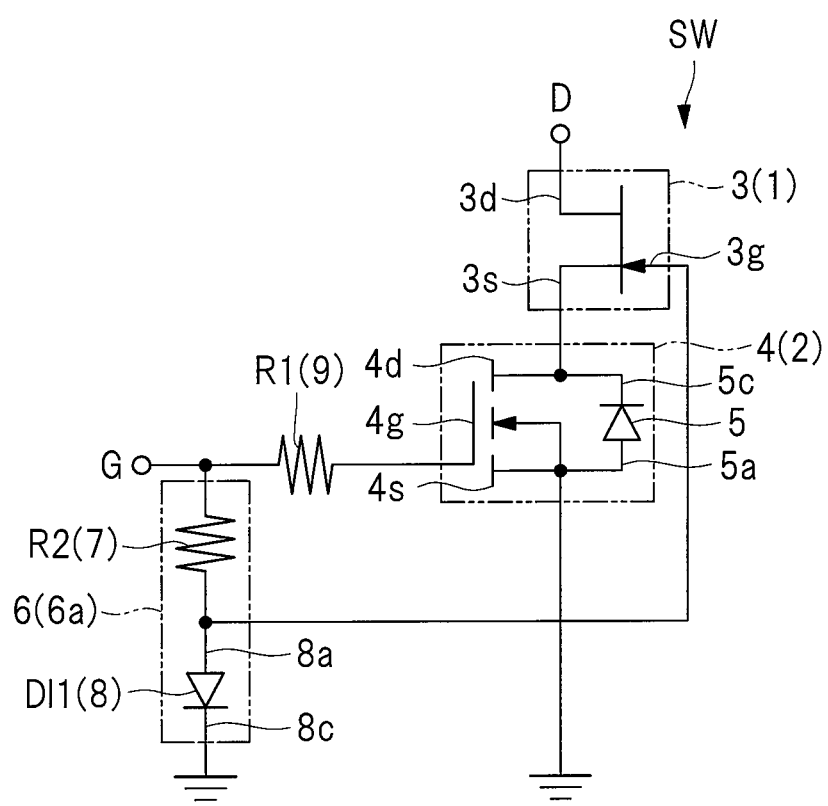
FIG. 1 is a circuit diagram of a configuration of a semiconductor device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, typical embodiments will be described in detail based on drawings. Note that the components having the same function are denoted by the same reference characters throughout the drawings for describing the embodiments, and the repetitive description thereof is omitted. In addition, the description of the same or similar portions is not repeated in principle unless particularly required in the following embodiments.

Also, in the drawings used in the embodiments, hatching is sometimes omitted even in a cross-sectional view so as to make the drawings easy to see. Further, hatching is sometimes used even in a plan view so as to make the drawings easy to see.

Furthermore, in the following embodiments, the case in which a semiconductor device includes a MOSFET which is a type of MISFET (metal insulator semiconductor field effect transistor) will be described as an example. However, a semiconductor device may include any type of MISFET other than MOSFET.

First Embodiment

Hereinafter, a semiconductor device of the first embodiment will be described in detail with reference to drawings.

Circuit Configuration of Semiconductor Device

Figure 2:
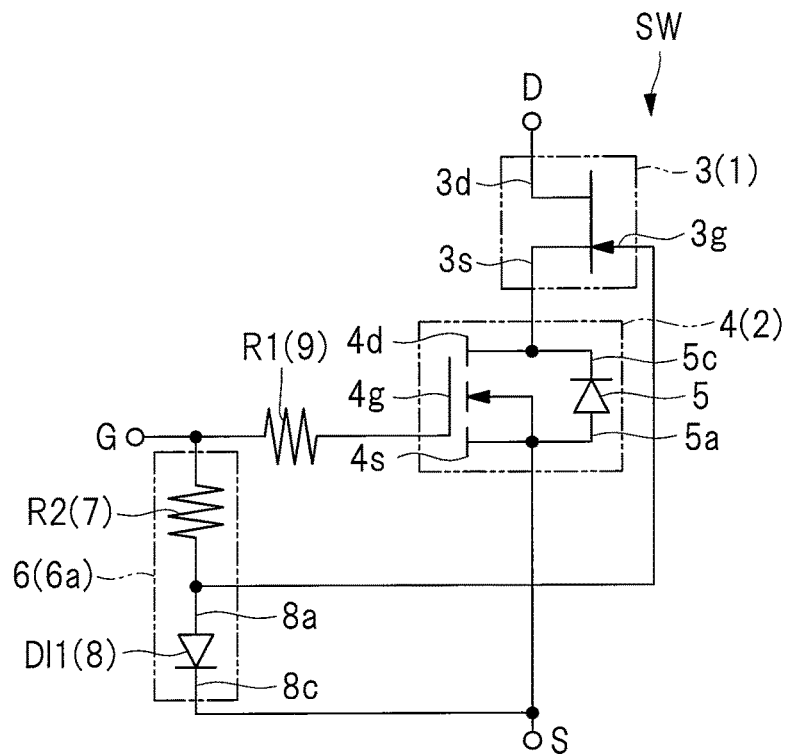
FIG. 2 is a circuit diagram of a configuration of a semiconductor device of the first embodiment.

First, a circuit configuration of the semiconductor device of the first embodiment will be described. FIG. 1 and FIG. 2 are circuit diagrams each showing the configuration of the semiconductor device of the first embodiment.

As shown in FIG. 1, the semiconductor device includes a semiconductor chip 1, a semiconductor chip 2, a terminal G and a terminal D. A normally-on junction FET 3 is formed in the semiconductor chip 1, and a normally-off MOSFET 4 is formed in the semiconductor chip 2. The junction FET 3 has a gate electrode 3g, a source electrode 3s and a drain electrode 3d. The MOSFET 4 has a gate electrode 4g, a source electrode 4s and a drain electrode 4d. The junction FET 3 can be an n channel junction FET and the MOSFET 4 can be an n channel MOSFET.

In the specification of this application, a normally-on FET indicates a FET which is in a conduction state, that is, an on-state in which a current flows between a source electrode and a drain electrode when no voltage is applied to a gate electrode. Meanwhile, a normally-off FET indicates a FET which is in a non-conduction state, that is, an off-state in which a current does not flow between a source electrode and a drain electrode when no voltage is applied to a gate electrode.

Therefore, the normally-on junction FET 3 indicates a junction FET which is in an on-state when no voltage is applied to the gate electrode 3g, that is, when the potential of the gate electrode 3g is the ground potential (0V). For example, when the normally-on junction FET 3 is an n channel junction FET, the threshold voltage is negative.

On the other hand, the normally-off MOSFET 4 indicates a MOSFET which is in an off-state when no voltage is applied to the gate electrode 4g, that is, when the potential of the gate electrode 4g is the ground potential (0 V). For example, when the normally-off MOSFET 4 is an n channel MOSFET, the threshold voltage is positive.

Note that the semiconductor device of the first embodiment shown in FIG. 1 is referred to also as a switching element SW (the same is true of the respective modification examples and embodiments described below).

The source electrode 3s of the junction FET 3 is electrically connected to the drain electrode 4d of the MOSFET 4, and the drain electrode 3d of the junction FET 3 is electrically connected to the terminal D. The gate electrode 4g of the MOSFET 4 is electrically connected to the terminal G through, for example, a resistor R1 corresponding to an input resistance, and the source electrode 4s of the MOSFET 4 is grounded. Namely, the potential of the source electrode 4s of the MOSFET 4 is equal to the ground potential.

Thus, the junction FET 3 and the MOSFET 4 are connected in series between the terminal D and the ground potential. The connection like this is referred to as the cascode connection. Namely, the semiconductor device includes the junction FET 3 and the MOSFET 4 in cascode connection between the terminal D and the ground potential.

As described above, the junction FET 3 is an n channel junction FET and the MOSFET 4 is an n channel MOSFET. In such a case, the junction FET 3 and the MOSFET 4 can be cascode-connected, that is, connected in series by electrically connecting the source electrode 3s of the junction FET 3 and the drain electrode 4d of the MOSFET 4.

Note that, when the junction FET 3 is an n channel junction FET and the MOSFET 4 is a p channel MOSFET, the source electrode 3s of the junction FET 3 is electrically connected to the source electrode 4s of the MOSFET 4.

A diode 5 is connected between the drain electrode 4d and the source electrode 4s of the MOSFET 4. An anode 5a of the diode 5 is electrically connected to the source electrode 4s of the MOSFET 4, and a cathode 5c of the diode 5 is electrically connected to the drain electrode 4d of the MOSFET 4. The diode 5 is a parasitic diode formed because of the structure of the MOSFET 4.

Preferably, the MOSFET 4 includes a semiconductor region made of silicon (Si) and the junction FET 3 includes a semiconductor region made of semiconductor with a band gap larger than that of silicon (Si), for example, silicon carbide (SiC). Accordingly, the withstand voltage of the junction FET 3 can be improved in comparison with the withstand voltage of the MOSFET 4. In addition, the withstand voltage of the semiconductor device having the junction FET 3 and the MOSFET 4 in cascode connection is determined by the junction FET 3 having the withstand voltage higher than that of the MOSFET 4. Therefore, the withstand voltage of the semiconductor device can be improved when the junction FET 3 includes a semiconductor region made of, for example, silicon carbide (SiC).

In the first embodiment, the gate electrode 3g of the junction FET 3 is electrically connected to the gate electrode 4g of the MOSFET 4.

Here, the case in which the MOSFET 4 is conducted or brought into an on-state by applying a positive voltage of, for example, about 15 V to the terminal G, that is, the gate electrode 4g of the MOSFET 4 is considered. In such a case, a positive voltage equal to the voltage applied to the gate electrode 4g of the MOSFET 4 or lower than the voltage applied to the gate electrode 4g of the MOSFET 4 is applied also to the gate electrode 3g of the junction FET 3. Therefore, as described later with reference to FIG. 12 and FIG. 13, the on-resistance of the junction FET 3 can be reduced. Accordingly, it is possible to achieve both of the improvement of the withstand voltage and the reduction of the on-resistance in the semiconductor device.

Note that, when a voltage of about 0 V is applied to the terminal G, that is, the gate electrode 4g of the MOSFET 4 and the MOSFET 4 is closed or brought into an off-state, the voltage approximately equal to the voltage applied to the gate electrode 4g of the MOSFET 4 is applied also to the gate electrode 3g of the junction FET 3. Since the junction FET 3 is a normally-on junction FET, the junction FET 3 is in an on-state at this time, but since the MOSFET 4 in cascode connection with the junction FET 3 is in an off-state, no current flows in the junction FET 3.

Preferably, the semiconductor device has a voltage control element 6 which controls the voltage applied to the gate electrode 3g of the junction FET 3, and the gate electrode 3g of the junction FET 3 is electrically connected to the gate electrode 4g of the MOSFET 4 through the voltage control element 6. Thus, a voltage different from the voltage applied to the gate electrode 4g of the MOSFET 4 of, for example, about 15 V can be applied to the gate electrode 3g of the junction FET 3.

Though described later in the second modification example of the first embodiment with reference to FIG. 15, the voltage control element 6 may be a voltage applying unit 6a which applies a voltage to the gate electrode 3g of the junction FET 3. The voltage applying unit 6a applies a voltage with a polarity opposite to that of the voltage applied to the gate electrode 3g of the junction FET 3 to bring the junction FET 3 into an off-state, to the gate electrode 3g of the junction FET 3 when the MOSFET 4 is in an on-state. In other words, the voltage applying unit 6a applies a voltage with a polarity opposite to that of the voltage applied to the gate electrode 3g of the junction FET 3 when the junction FET 3 is brought into an off-state, to the gate electrode 3g of the junction FET 3 when the MOSFET 4 is in an on-state. At this time, the gate electrode 3g of the junction FET 3 is electrically connected to the gate electrode 4g of the MOSFET 4 through the voltage applying unit 6a.

As shown in FIG. 1, the voltage control element 6, that is, the voltage applying unit 6a includes, for example, a resistor R2 and a diode DI1. The gate electrode 3g of the junction FET 3 is electrically connected to the terminal G through the resistor R2. Namely, the gate electrode 3g of the junction FET 3 is electrically connected to the gate electrode 4g of the MOSFET 4 through the resistor R2. An anode 8a of the diode DI1 is electrically connected to one end of the resistor R2 on the side of the gate electrode 3g, and a cathode 8c of the diode DI1 is grounded. The diode DI1 has a pn junction made of, for example, a p type silicon and an n type silicon.

In such a case, when a positive voltage of, for example, about 15 V is applied to the terminal G, that is, the gate electrode 4g of the MOSFET 4 to bring the MOSFET 4 into an on-state, a current flows from the terminal G through the resistor R2 and the diode DI1. Then, the voltage applied to the anode 8a of the diode DI1 is the voltage equal to the internal potential of the diode DI1. When the diode DI1 has a pn junction made of, for example, a p type silicon and an n type silicon as described above, the internal potential of the diode DI1 is determined by the band gap of silicon of 1.17 eV, and has a constant value of about 0.6 to 0.7 V.

Thus, a constant voltage equal to the internal potential of the diode DI1 is applied to the gate electrode 3g of the junction FET 3. In such a case, the on-resistance of the junction FET 3 can be reduced and further the on-resistance of the junction FET 3 can be stably controlled.

The magnitude of the resistor R2 is not particularly limited, but can be about one hundred times larger than the resistor R1 and set to be about 5 to 10 kΩ. Accordingly, the above-described voltage equal to the internal potential of the diode DI1 is likely to be applied to the gate electrode 3g.

Meanwhile, when the MOSFET 4 is in an off-state, for example, by applying the voltage of 0 V to the gate electrode 4g of the MOSFET 4, the voltage of 0 V is applied also to the gate electrode 3g of the junction FET 3.

Note that the circuit configuration of the semiconductor device of the first embodiment may be the configuration shown in FIG. 2 instead of the configuration shown in FIG. 1. Namely, the semiconductor device of the first embodiment may have a terminal S and the source electrode 4s of the MOSFET 4 may be electrically connected to the terminal S. At this time, the junction FET 3 and the MOSFET 4 are connected in series, that is, are cascode-connected between the terminal D and the terminal S. Thus, the semiconductor device has the junction FET 3 and the MOSFET 4 in cascode connection between the terminal D and the terminal S.

Further, it is not always necessary that the cathode 8c of the diode DI1 is grounded as shown in FIG. 1, but the cathode 8c may be electrically connected to the source electrode 4s of the MOSFET 4 as shown in FIG. 2.

In addition, as described later with reference to FIG. 9, the semiconductor device of the first embodiment may have a chip 7, a chip 8 and a chip 9. The chip 7 includes the resistor R2, the chip 8 includes the diode DI1 and the chip 9 includes the resistor R1.

Configuration of Semiconductor Chip in Which Junction FET is Formed

Figure 3:
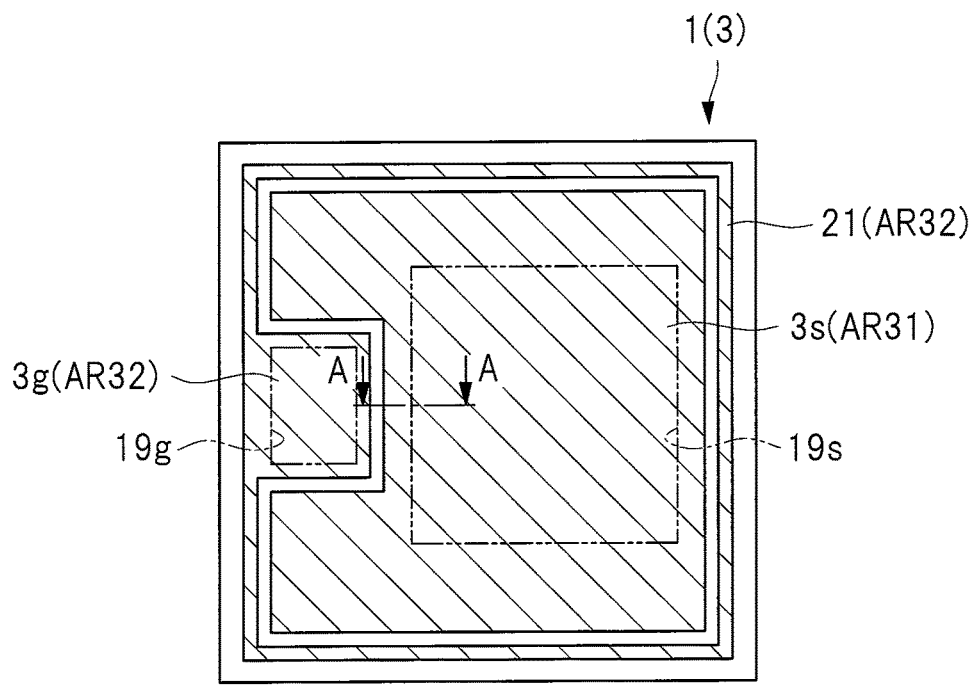
FIG. 3 is a plan view of a configuration of a semiconductor chip in which a junction FET is formed in the first embodiment.
Figure 4:
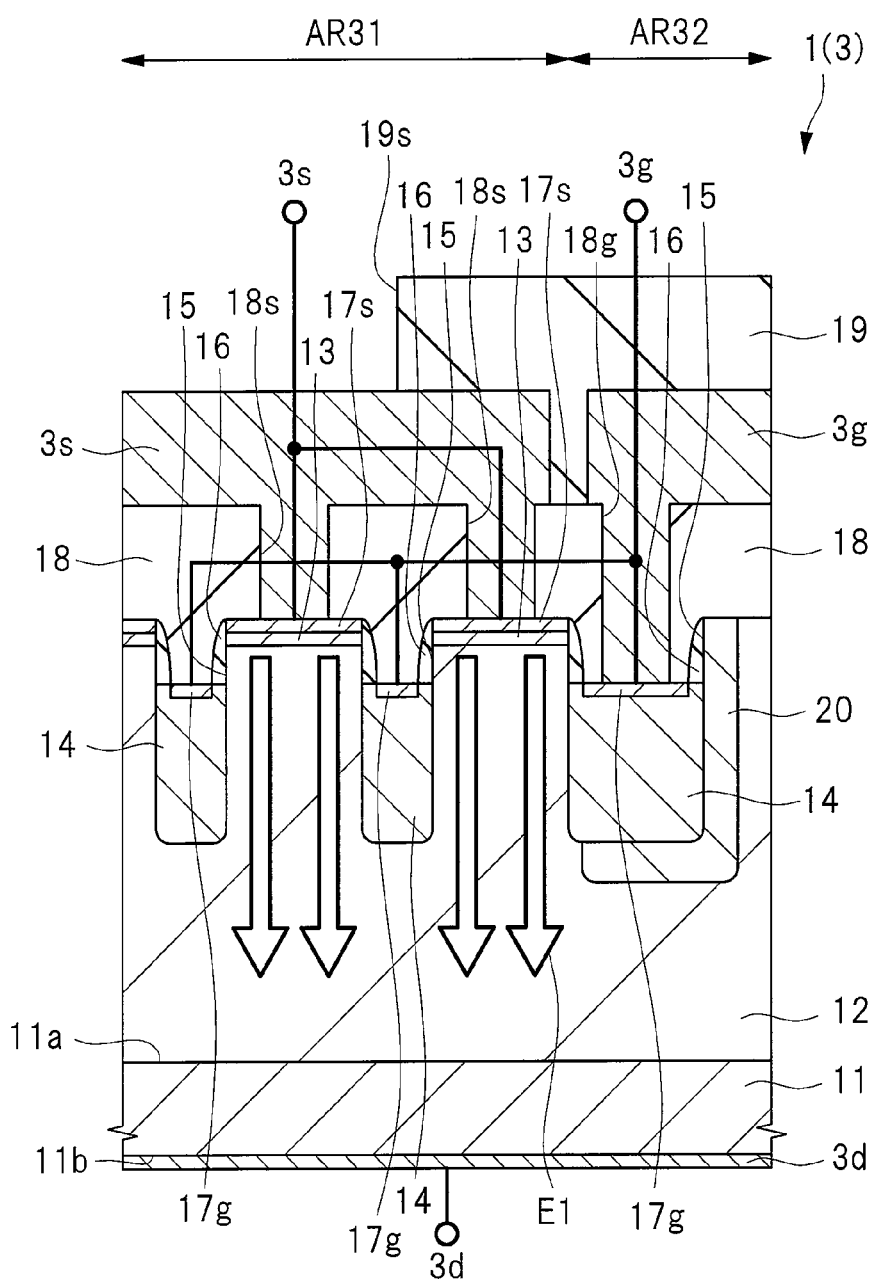
FIG. 4 is a cross-sectional view showing a principal part of the configuration of the semiconductor chip in which the junction FET is formed in the first embodiment.

Next, the configuration of the semiconductor chip 1 in which the junction FET 3 is formed will be described. FIG. 3 is a plan view of the configuration of the semiconductor chip in which the junction FET is formed in the first embodiment. FIG. 4 is a cross-sectional view showing a principal part of the configuration of the semiconductor chip in which the junction FET is formed in the first embodiment. FIG. 3 shows the state seen through a surface protection film 19 (see FIG. 4) for easy understanding. FIG. 4 is a cross-sectional view taken along the line A-A of FIG. 3. Also, the flow of electrons in the junction FET 3 when the junction FET 3 is in an on-state is indicated by arrows E1 in FIG. 4.

In the following description, a vertical FET formed on a silicon carbide (SiC) substrate is taken as an example of the junction FET 3.

As shown in FIG. 3 and FIG. 4, the junction FET 3, that is, the semiconductor chip 1 includes an $n^+$ type semiconductor substrate 11, an $n^-$ type drift layer 12, an $n^+$ type source layer 13 and a p type gate layer 14 in addition to the gate electrode 3g, the source electrode 3s and the drain electrode 3d described above. The $n^+$ type semiconductor substrate 11 is a semiconductor substrate made of SiC, and the $n^-$ type drift layer 12, the $n^+$ type source layer 13 and the p type gate layer 14 are semiconductor regions made of, for example, SiC. Namely, the junction FET 3 includes a semiconductor substrate made of SiC and semiconductor regions made of SiC formed in the semiconductor substrate. In addition, the semiconductor chip 1 includes the $n^+$ type semiconductor substrate 11 and the junction FET 3 formed on the $n^+$ type semiconductor substrate 11.

The $n^+$ type semiconductor substrate 11 is a semiconductor region to be a drain region of the junction FET 3. The $n^+$ type semiconductor substrate 11 has a cell formation region AR31 on the side of a main surface 11a and a peripheral region AR32 on the side of the main surface 11a. The cell formation region AR31 is a region in which the junction FET 3 is formed. The peripheral region AR32 is disposed on the peripheral side of the $n^+$ type semiconductor substrate 11 relative to the cell formation region AR31.

The $n^-$ type drift layer 12 with an impurity concentration lower than that of the $n^+$ type semiconductor substrate 11 is formed on the main surface 11a of the $n^+$ type semiconductor substrate 11 in the cell formation region AR31 and the peripheral region AR32. In the cell formation region AR31, a plurality of the $n^+$ type source layers 13 with an impurity concentration higher than that of the $n^-$ type drift layer 12 are formed at constant intervals in an upper layer part of the $n^-$ type drift layer 12. The $n^+$ type source layer 13 is a semiconductor region to be the source region of the junction FET 3. These $n^+$ type source layers 13 extend in stripes along a first direction (direction perpendicular to the plane of the paper of FIG. 4) in the main surface 11a of the $n^+$ type semiconductor substrate 11.

A trench 15 is formed in a part of a front surface or an upper surface of the $n^-$ type drift layer 12 located between the adjacent $n^+$ type source layers 13. The trench 15 is formed in a part of the $n^-$ type drift layer 12 adjacent to the $n^+$ type source layer 13 and is arranged along an extending direction of the $n^+$ type source layer 13 (first direction) when seen in a plan view. The p type gate layer 14 is formed on a part of the $n^-$ type drift layer 12 exposed at the bottom of the trench 15. Namely, the p type gate layer 14 is formed along the extending direction of the $n^+$ type source layer 13 (first direction). Also, a sidewall spacer 16 made of, for example, a silicon oxide film is formed on each side wall of the trench 15. Note that, in a part of the $n^-$ type drift layer 12 located below the sidewall spacer 16, an n type counter-doped layer (not shown) may be formed so as to be adjacent to the p type gate layer 14.

In the specification of this application, the case when seen in a plan view indicates the case of being seen from the direction perpendicular to the main surface of the semiconductor substrate.

In the example shown in FIG. 4, a bottom surface of the trench 15 is located at a position lower than the $n^+$ type source layer 13 and the sidewall spacer 16 made of silicon oxide as an insulating material is formed on the side wall of the trench 15. Thus, the p type gate layer 14 is not in contact with the $n^+$ type source layer 13.

In the junction FET 3 with the configuration described above, the p type gate layer 14 can be formed by doping an impurity into a part of the $n^-$ type drift layer 12 exposed at the bottom of the trench 15 by the vertical ion implantation.

In the cell formation region AR31, a source contact layer 17s made of a nickel silicide film is formed on a front surface or an upper surface of the $n^+$ type source layer 13, and a gate contact layer 17g made of a nickel silicide film is formed on a front surface or an upper surface of the p type gate layer 14. In addition, in the peripheral region AR32, a gate contact layer 17g made of a nickel silicide film is formed on a front surface or an upper surface of a part of the p type gate layer 14 exposed from the sidewall spacer 16.

An interlayer insulating film 18 is formed so as to cover the $n^+$ type source layer 13 having the source contact layer 17s formed on an upper surface thereof. The interlayer insulating film 18 is made of, for example, a silicon oxide film. Note that, in the cell formation region AR31, the interlayer insulating film 18 is formed so as to cover the $n^+$ type source layer 13 having the source contact layer 17s formed on the upper surface thereof and the p type gate layer 14 having the gate contact layer 17g formed on the upper surface thereof. Meanwhile, in the peripheral region AR32, the interlayer insulating film 18 is formed so as to cover the p type gate layer 14 having the gate contact layer 17g formed on the upper surface thereof and the $n^-$ type drift layer 12.

In the cell formation region AR31, a contact hole 18s which passes through the interlayer insulating film 18 to reach the source contact layer 17s is formed in the interlayer insulating film 18. In the cell formation region AR31, the source electrode 3s is formed in the contact hole 18s and on the interlayer insulating film 18. Therefore, the source contact layer 17s is electrically connected to the source electrode 3s through the contact hole 18s. The source electrode 3s is made of, for example, a metal film containing aluminum (Al) as a main component. Note that the case in which the source electrode 3s contains aluminum as a main component means that the weight ratio of aluminum in the source electrode 3s is 50% or more.

Meanwhile, in the peripheral region AR32, a contact hole 18g which passes through the interlayer insulating film 18 to reach the gate contact layer 17g is formed in the interlayer insulating film 18. In the peripheral region AR32, the gate electrode 3g in the same layer as the source electrode 3s is formed in the contact hole 18g and on the interlayer insulating film 18. Therefore, the gate contact layer 17g is electrically connected to the gate electrode 3g through the contact hole 18g. The gate electrode 3g is made of a metal film in the same layer as the source electrode 3s, for example, a metal film containing aluminum as a main component.

In the cell formation region AR31 and the peripheral region AR32, the surface protection film 19 is formed on the interlayer insulating film 18 so as to cover the source electrode 3s and the gate electrode 3g. In the cell formation region AR31, an opening 19s which passes through the surface protection film 19 to reach the source electrode 3s is formed in the surface protection film 19, and a source pad is formed of the source electrode 3s exposed at the bottom of the opening 19s. In addition, in the peripheral region AR32, an opening 19g which passes through the surface protection film 19 to reach the gate electrode 3g is formed, and a gate pad is formed of the gate electrode 3g exposed at the bottom of the opening 19g.

Note that a p type termination layer 20 for field relaxation is formed in the peripheral region AR32. The p type termination layer 20 is a p type semiconductor region formed by implanting impurity ion into the n⁻ type drift layer 12 in the peripheral region AR32.

Also, in the peripheral region AR32, a guard ring wiring 21 (see FIG. 3) and an n⁺ type guard ring layer (not shown) are formed as guard ring on an outer side of the p type termination layer 20, that is, in an outer peripheral part of the n⁺ type semiconductor substrate 11. The guard ring wiring 21 is made of a metal film in the same layer as the source electrode 3s and the gate electrode 3g, for example, a metal film containing aluminum as a main component. The n⁺ type guard ring layer (not shown) is an n type semiconductor region formed by implanting impurity ion into the n⁻ type drift layer 12 on the main surface 11a in the outer peripheral part of the n⁺ type semiconductor substrate 11 in the peripheral region AR32.

The drain electrode 3d is formed on a rear surface 11b of the n⁺ type semiconductor substrate 11. The drain electrode 3d is made of, for example, a conductive film containing nickel silicide as a main component. As described above, the junction FET 3 in the first embodiment is a switching element serving as a three-terminal element having the source electrode 3s and the gate electrode 3g provided on the side of the main surface 11a of the n⁺ type semiconductor substrate 11 and the drain electrode 3d provided on the side of the rear surface 11b of the n⁺ type semiconductor substrate 11.

Configuration of Semiconductor Chip in Which MOSFET is Formed

Figure 5:
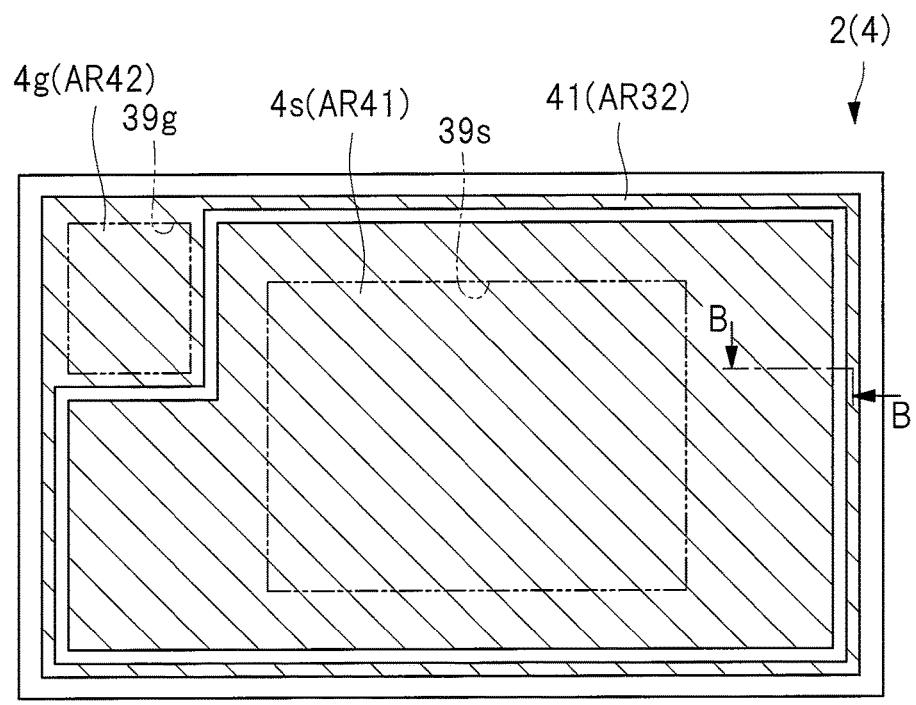
FIG. 5 is a plan view of a configuration of a semiconductor chip in which a MOSFET is formed in the first embodiment.
Figure 6:
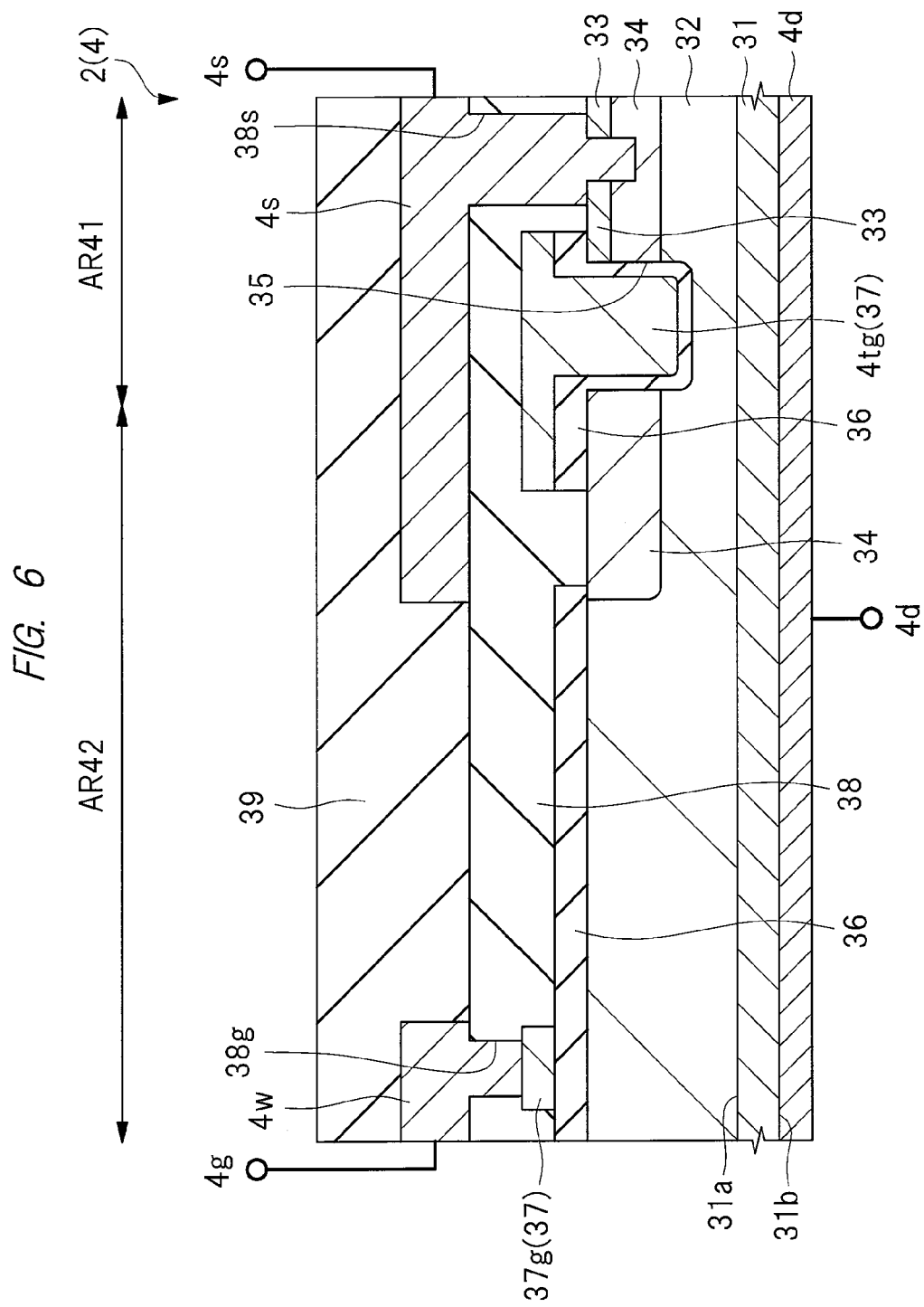
FIG. 6 is a cross-sectional view showing a principal part of the configuration of the semiconductor chip in which the MOSFET is formed in the first embodiment.

Next, the configuration of the semiconductor chip 2 in which the MOSFET 4 is formed will be described. FIG. 5 is a plan view of the configuration of the semiconductor chip in which the MOSFET is formed in the first embodiment. FIG. 6 is a cross-sectional view showing a principal part of the configuration of the semiconductor chip in which the MOSFET is formed in the first embodiment. FIG. 5 shows the state seen through a surface protection film 39 (see FIG. 6) for easy understanding. FIG. 6 is a cross-sectional view taken along the line B-B of FIG. 5. In the following description, a vertical MOSFET formed on a silicon (Si) substrate is taken as an example of the MOSFET 4.

As shown in FIG. 5 and FIG. 6, the MOSFET 4, that is, the semiconductor chip 2 includes an n⁺ type semiconductor substrate 31, an n⁻ type drift layer 32, an n⁺ type source layer 33, a p type body layer 34 and a trench gate electrode 4tg in addition to the gate electrode 4g, the source electrode 4s and the drain electrode 4d described above. The n⁺ type semiconductor substrate 31 is a semiconductor substrate made of Si, and the n⁻ type drift layer 32, the n⁺ type source layer 33 and the p type body layer 34 are semiconductor regions made of, for example, Si. Namely, the MOSFET 4 includes a semiconductor substrate made of Si and semiconductor regions made of Si formed in the semiconductor substrate. In addition, the semiconductor chip 2 includes the n⁺ type semiconductor substrate 31 and the MOSFET 4 formed on the n⁺ type semiconductor substrate 31.

The n⁺ type semiconductor substrate 31 is a semiconductor region to be the drain region of the MOSFET 4. The n⁺ type semiconductor substrate 31 has a cell formation region AR41 on the side of a main surface 31a and a peripheral region AR42 on the side of the main surface 31a. The cell formation region AR41 is a region in which the MOSFET 4 is formed. The peripheral region AR42 is disposed on the peripheral side of the n⁺ type semiconductor substrate 31 relative to the cell formation region AR41.

The n⁻ type drift layer 32 with an impurity concentration lower than that of the n⁺ type semiconductor substrate 31 is formed on the main surface 31a of the n⁺ type semiconductor substrate 31 in the cell formation region AR41 and the peripheral region AR42. In the cell formation region AR41 and the peripheral region AR42, the p type body layer 34 is formed in an upper layer part of the n⁻ type drift layer 32. The p type body layer 34 is a semiconductor region to be the channel region of the MOSFET 4.

In the cell formation region AR41, the n⁺ type source layer 33 with an impurity concentration higher than that of the n⁻ type drift layer 32 is formed in an upper layer part of the p type body layer 34. The n⁺ type source layer 33 is a semiconductor region to be the source region of the MOSFET 4.

In the cell formation region AR41, a trench 35 which passes through the n⁺ type source layer 33 and the p type body layer 34 to reach the n⁻ type drift layer 32 is formed in the n⁺ type source layer 33 and the p type body layer 34. In the cell formation region AR41, an insulating film 36 made of, for example, a silicon oxide film is formed on an inner wall of the trench 35 and on the n⁺ type source layer 33. A part of the insulating film 36 formed on the inner wall of the trench 35 is a gate insulating film. A conductive film 37 made of, for example, a polycrystalline silicon film to which an impurity is introduced by ion implantation is formed on the insulating film 36. In addition, the trench gate electrode 4tg made of the conductive film 37 embedded in the trench 35 is formed on the insulating film 36 in the trench 35.

Note that, in the peripheral region AR42, the insulating film 36 is formed on the n⁻ type drift layer 32 and the p type body layer 34, the conductive film 37 is formed on the insulating film 36, and a guard ring layer 37g made of the conductive film 37 formed on the insulating film 36 is formed.

In the cell formation region AR41 and the peripheral region AR42, an interlayer insulating film 38 is formed on the n⁻ type drift layer 32, the n⁺ type source layer 33 and the p type body layer 34 so as to cover the insulating film 36 and the conductive film 37. The interlayer insulating film 38 is made of, for example, a silicon oxide film. Note that, in the cell formation region AR41, the interlayer insulating film 38 is formed on the n⁺ type source layer 33 so as to cover the insulating film 36 and the trench gate electrode 4*tg*. Meanwhile, in the peripheral region AR42, the interlayer insulating film 38 is formed on the n⁻ type drift layer 32 and the p type body layer 34 so as to cover the insulating film 36 and the guard ring layer 37*g*.

In the cell formation region AR41, a contact hole 38*s* which passes through the interlayer insulating film 38 and the n⁺ type source layer 33 to reach the p type body layer 34 is formed in the interlayer insulating film 38. In the cell formation region AR41, the source electrode 4*s* is formed in the contact hole 38*s* and on the interlayer insulating film 38. Therefore, the n⁺ type source layer 33 and the p type body layer 34 are electrically connected to the source electrode 4*s* through the contact hole 38*s*. The source electrode 4*s* is made of, for example, a metal film containing aluminum (Al) as a main component.

Meanwhile, in the peripheral region AR42, a contact hole 38*g* which passes through the interlayer insulating film 38 to reach the guard ring layer 37*g* is formed in the interlayer insulating film 38. In the peripheral region AR42, a guard ring wiring 4*w* in the same layer as the source electrode 4*s* is formed in the contact hole 38*g* and on the interlayer insulating film 38. In addition, though not shown, the trench gate electrode 4*tg* is electrically connected to the guard ring wiring 4*w* and the guard ring wiring 4*w* is electrically connected to the gate electrode 4*g*. Therefore, the trench gate electrode 4*tg* is electrically connected to the gate electrode 4*g* through the guard ring layer 37*g*, the contact hole 38*g* and the guard ring wiring 4*w*. The guard ring wiring 4*w* is made of a metal film in the same layer as the source electrode 4*s*, for example, a metal film containing aluminum as a main component.

In the cell formation region AR41 and the peripheral region AR42, the surface protection film 39 is formed on the interlayer insulating film 38 so as to cover the source electrode 4*s* and the guard ring wiring 4*w*. In the cell formation region AR41, an opening 39*s* (see FIG. 5) which passes through the surface protection film 39 to reach the source electrode 4*s* is formed in the surface protection film 39, and a source pad is formed of the source electrode 4*s* exposed at the bottom of the opening 39*s*. In addition, in the peripheral region AR42, an opening 39*g* (see FIG. 5) which passes through the surface protection film 39 to reach the gate electrode 4*g* is formed, and a gate pad is formed of the gate electrode 4*g* exposed at the bottom of the opening 39*g*.

The drain electrode 4*d* is formed on a rear surface 31*b* of the n⁺ type semiconductor substrate 31. The drain electrode 4*d* is made of, for example, a conductive film containing nickel silicide as a main component. As described above, the MOSFET 4 in the first embodiment is a switching element serving as a three-terminal element having the source electrode 4*s* and the gate electrode 4*g* provided on the side of the main surface 31*a* of the n⁺ type semiconductor substrate 31 and the drain electrode 4*d* provided on the side of the rear surface 31*b* of the n⁺ type semiconductor substrate 31.

Electronic System in Which Semiconductor Device is Used

Next, an electronic system in which the semiconductor device of the first embodiment is used will be described.

Figure 7:
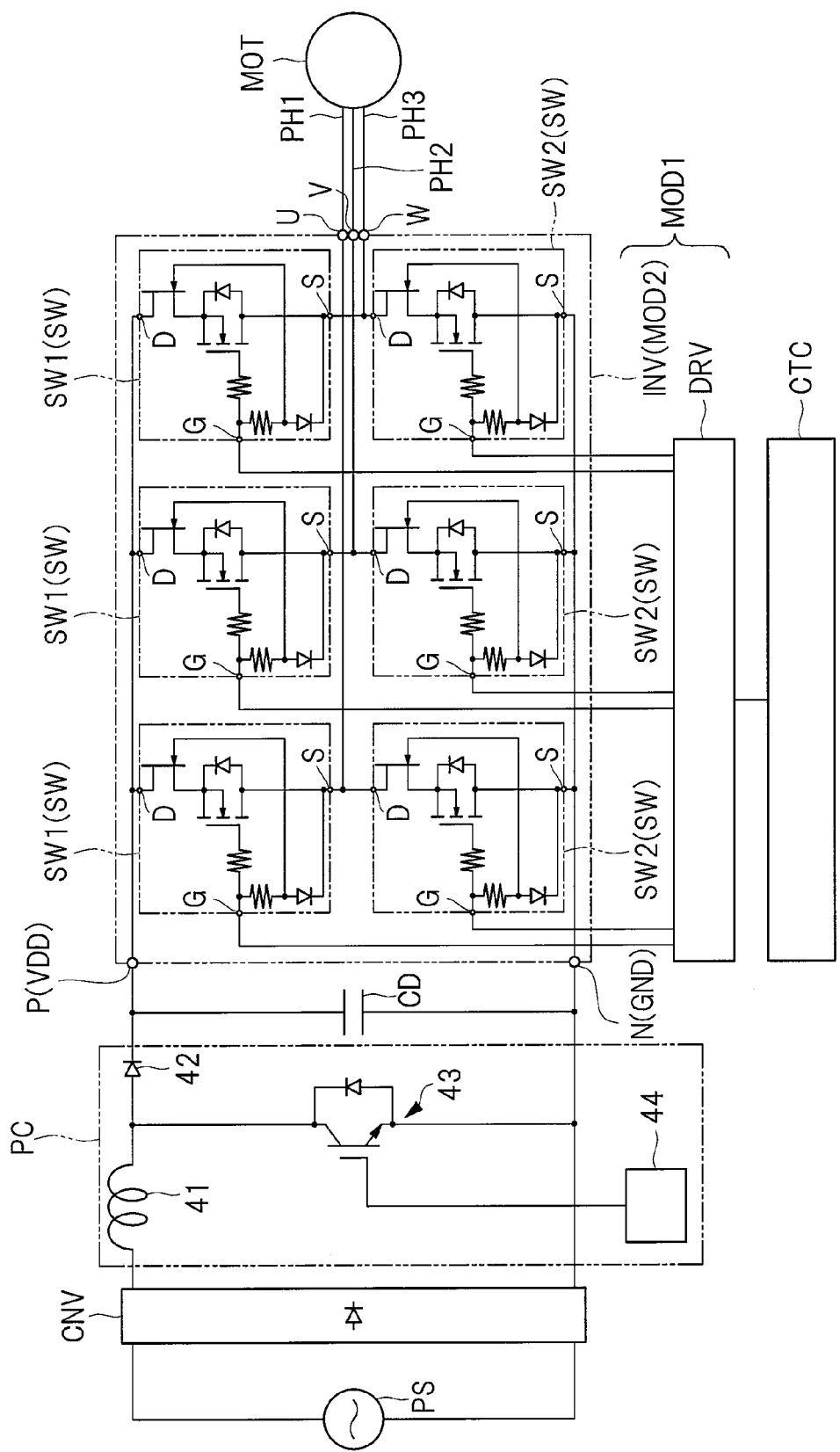
FIG. 7 is a circuit block diagram showing an example of an electronic system in which the semiconductor device of the first embodiment is used.

FIG. 7 is a circuit block diagram showing an example of an electronic system in which the semiconductor device of the first embodiment is used.

As shown in FIG. 7, for example, the electronic system in which the semiconductor device of the first embodiment is used includes a load such as a motor MOT as an AC motor, an inverter INV, a PFC (Power Factor Correction) circuit PC, a capacitor element CD, a converter CNV, a power source PS, a control circuit CTC and a gate driver DRV. The electronic system like this is, for example, an air-conditioning system such as an air conditioner. Here, a three-phase motor is used as the motor MOT. The three-phase motor is configured to be driven by three-phase voltages each having different phases.

In the electronic system shown in FIG. 7, the power source PS is connected to the inverter INV through the converter CNV, the PFC circuit PC and the capacitor element CD, and the DC voltage of the inverter CNV, that is, the DC power is supplied to the inverter INV. Since the converter CNV is interposed between the power source PS and the inverter INV, the AC voltage of the power source PS is converted to the DC voltage suitable for the motor drive and is then supplied to the inverter INV. The PFC circuit PC includes an inductor 41, an FRD (Fast Recovery Diode) 42, an IGBT (Insulated Gate Bipolar Transistor) 43 and a PFC-IC (Integrated circuit) 44, and is a circuit to bring the power factor of the power source close to 1.

The control circuit CTC is connected to the inverter INV through the gate driver DRV, and the gate driver DRV is controlled based on the control signal from the control circuit CTC and the inverter INV is controlled by the control signal from the gate driver DRV. Namely, the DC voltage, that is, the DC power is supplied to the inverter INV from the power source PS through the converter CNV and the PFC circuit PC. Then, the supplied DC voltage, that is, the DC power is converted into the AC voltage, that is, the AC power by the inverter INV controlled by the control circuit CTC and the gate driver DRV, and is supplied to the motor MOT, thereby driving the motor MOT.

The control circuit CTC incorporates a control semiconductor chip such as an MCU (Micro Controller Unit).

When the electronic system shown in FIG. 7 is, for example, an air-conditioning system, the motor MOT is a motor or a fan motor installed in a compressor of an outdoor unit of an air conditioner.

For example, as described later with reference to FIG. 8 and FIG. 9, an intelligent power module MOD1 is formed of the inverter INV and the gate driver DRV. Alternatively, as described later with reference to FIG. 10 and FIG. 11, a power module MOD2 is formed of the inverter INV.

In the example shown in FIG. 7, the motor MOT is a three-phase motor having a U phase PH1, a V phase PH2 and a W phase PH3. Thus, the inverter INV is configured to correspond to the three phases of the U phase PH1, the V phase PH2 and the W phase PH3. The inverter INV configured to correspond to the three phases has a total of six switching elements SW each including the semiconductor device of the first embodiment. Namely, the electronic system is provided with a plurality of switching elements SW, each of the plurality of switching elements SW includes the junction FET 3 (see FIG. 1) and the MOSFET 4 (see FIG. 1), and these switching elements SW constitute the inverter INV. Then, the motor MOT is driven by the inverter INV.

When the motor MOT is a two-phase motor, the inverter INV has a total of four switching elements SW each including the semiconductor device of the first embodiment.

In the inverter INV, the side close to the power source potential VDD relative to the input potential of the motor MOT is referred to as a high side. Also, in the inverter INV, the side close to the ground potential GND relative to the input potential of the motor MOT is referred to as a low side. In the example shown in FIG. 7, three switching elements SW1 are used as the switching elements SW on the high side, and three switching elements SW2 are used as the switching elements SW on the low side.

Among the terminal D, the terminal S and the terminal G of each of the three switching elements SW1 on the high side, the terminal D is electrically connected to the terminal P, the terminal S is connected to any one of the terminals U, V and W serving as an output terminal to the motor MOT, and the terminal G is electrically connected to the gate driver DRV. Further, among the terminal D, the terminal S and the terminal G of each of the three switching elements SW2 on the low side, the terminal D is connected to any one of the terminals U, V and W serving as an output terminal to the motor MOT, the terminal S is electrically connected to the terminal N, and the terminal G is electrically connected to the gate driver DRV.

The gate driver DRV drives the switching elements SW1 and SW2 so that the on-state or the off-state of the switching element SW1 on the high side and the on-state or the off-state of the switching element SW2 on the low side are alternately switched at each of the U phase PH1, the V phase PH2 and the W phase PH3. Thus, the inverter INV generates the AC voltage from the DC voltage and converts the DC power to the AC power. The motor MOT is driven by the AC power.

Intelligent Power Module

Next, an intelligent power module in which the semiconductor device of the first embodiment is used will be described. FIG. 8 is a circuit block diagram showing an example of an intelligent power module in which the semiconductor device of the first embodiment is used. FIG. 9 is a top view schematically showing an example of the intelligent power module in which the semiconductor device of the first embodiment is used. Note that FIG. 9 shows the state seen through a sealing resin.

The intelligent power module in which the semiconductor device of the first embodiment is used is formed of the inverter INV and the gate driver DRV shown in FIG. 7.

Figure 8:
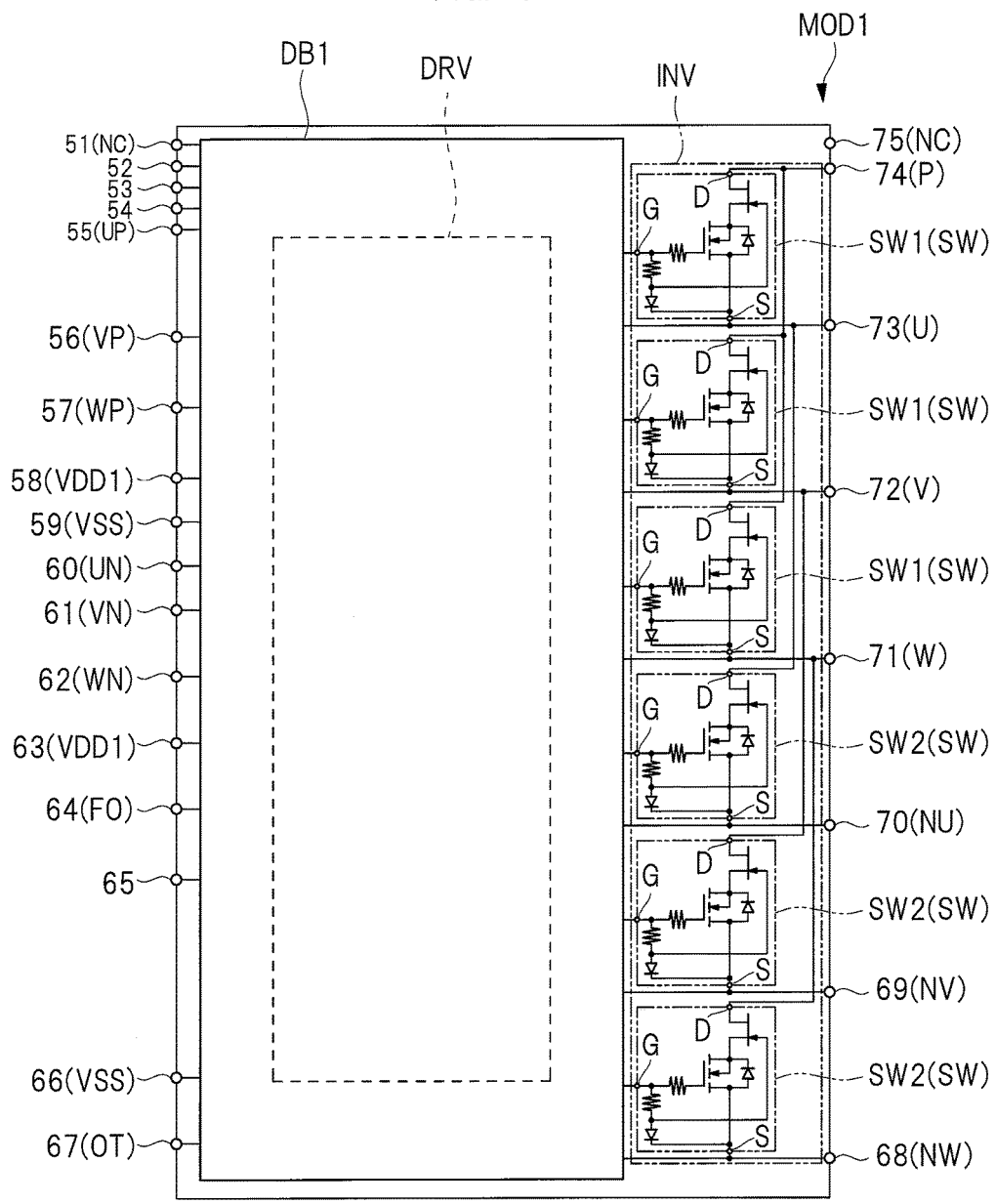
FIG. 8 is a circuit block diagram showing an example of an intelligent power module in which the semiconductor device of the first embodiment is used.

As shown in FIG. 8, the intelligent power module MOD1 has a driver block DB1 and the inverter INV. The driver block DB1 includes the gate driver DRV. The inverter INV includes the three switching elements SW1 on the high side and the three switching elements SW2 on the low side like the inverter INV shown in FIG. 7.

In addition, the intelligent power module MOD1 has terminals 51 to 75. Among them, each of the terminals 51 and 75 is a terminal NC which is not connected to the outside. The terminal 55 is a terminal UP to which the control signal to control the switching element SW1 at the U phase on the high side is input. The terminal 56 is a terminal VP to which the control signal to control the switching element SW1 at the V phase on the high side is input. The terminal 57 is a terminal WP to which the control signal to control the switching element SW1 at the W phase on the high side is input.

The terminals 58 and 63 are terminals VDD1 to which the power source potential is input. The terminals 59 and 66 are terminals VSS connected to the ground potential. The terminal 60 is a terminal UN to which the control signal to control the switching element SW2 at the U phase on the low side is input. The terminal 61 is a terminal VN to which the control signal to control the switching element SW2 at the V phase on the low side is input. The terminal 62 is a terminal WN to which the control signal to control the switching element SW2 at the W phase on the low side is input. The terminal 64 is an error output terminal FO. The terminal 67 is an overheat protection terminal OT.

The terminal 74 is a terminal P to which the power source potential VDD of the inverter INV is input. The terminal 73 is a terminal U from which the U phase is output, the terminal 72 is a terminal V from which the V phase is output, and the terminal 71 is a terminal W from which the W phase is output. The terminal 70 is a terminal NU at which the U phase is connected to the ground potential, the terminal 69 is a terminal NV at which the V phase is connected to the ground potential, and the terminal 68 is a terminal NW at which the W phase is connected to the ground potential.

Figure 9:
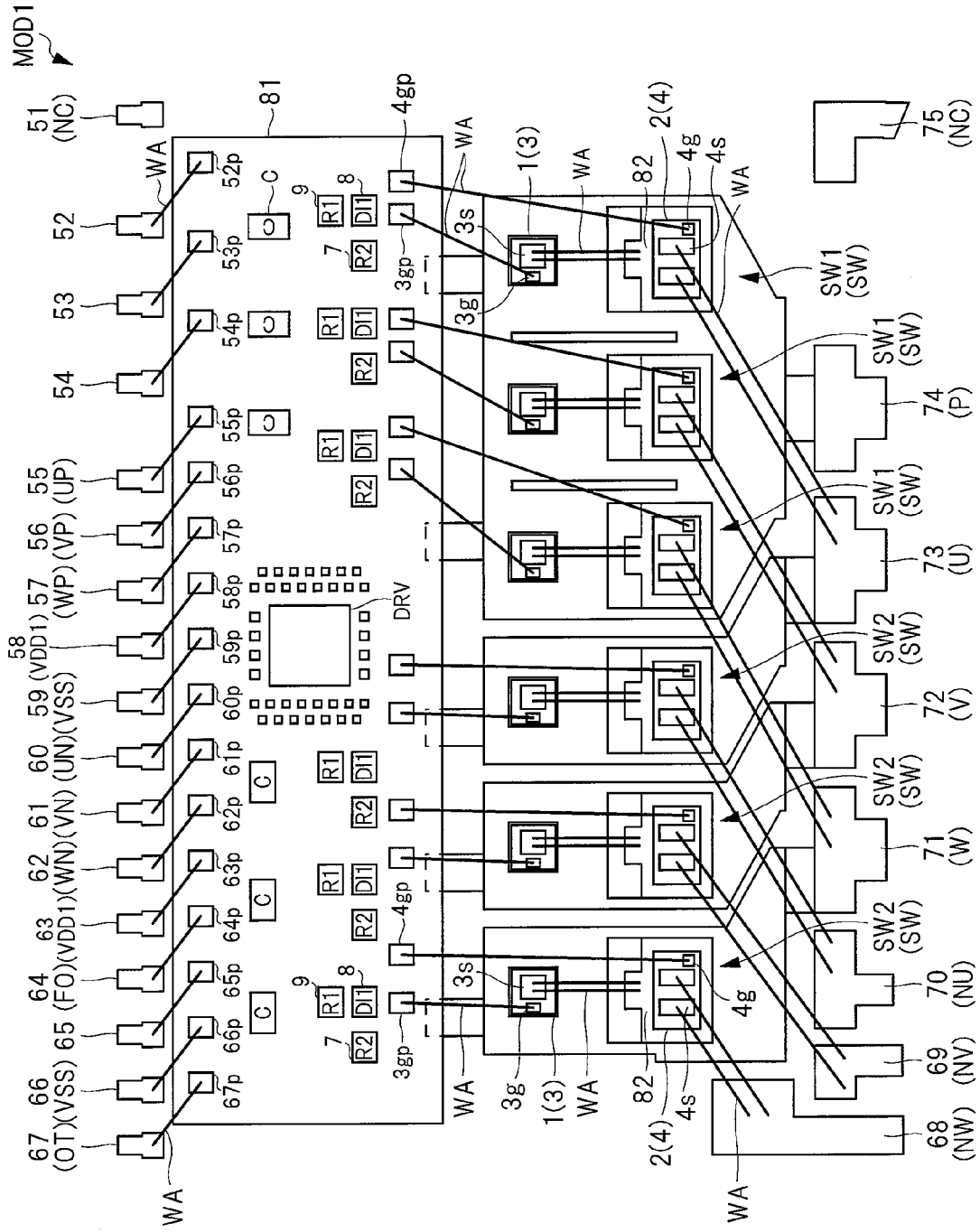
FIG. 9 is a top view schematically showing an example of the intelligent power module in which the semiconductor device of the first embodiment is used.

Further, the intelligent power module MOD1 has a wiring board 81 and an insulating plate 82 as shown in FIG. 9. Pads 52p to 67p are formed on the wiring board 81, and the pads 52p to 67p are respectively connected to the terminals 52 to 67 by bonding wires WA.

The chip 7 including the resistor R2 in each switching element SW, the chip 8 including the diode DI1 in each switching element SW, and the chip 9 including the resistor R1 in each switching element SW are mounted on the wiring board 81.

The semiconductor chip 1 (junction FET 3) included in each of the three switching elements SW1 on the high side is mounted on the terminal 74 serving as a lead, and the semiconductor chip 2 (MOSFET 4) included in each of the three switching elements SW1 on the high side is mounted on the terminal 74 via the insulating plate 82.

The semiconductor chip 1 (junction FET 3) included in the switching element SW2 at the U phase on the low side is mounted on the terminal 73 serving as a lead, and the semiconductor chip 2 included in the switching element SW2 at the U phase on the low side is mounted on the terminal 73 via the insulating plate 82.

The semiconductor chip 1 (junction FET 3) included in the switching element SW2 at the V phase on the low side is mounted on the terminal 72 serving as a lead, and the semiconductor chip 2 included in the switching element SW2 at the V phase on the low side is mounted on the terminal 72 via the insulating plate 82.

The semiconductor chip 1 (junction FET 3) included in the switching element SW2 at the W phase on the low side is mounted on the terminal 71 serving as a lead, and the semiconductor chip 2 included in the switching element SW2 at the W phase on the low side is mounted on the terminal 71 via the insulating plate 82.

In each of the six switching elements SW, the gate electrode 3g of the semiconductor chip 1 (junction FET 3) is electrically connected to the pad 3gp formed on the wiring board 81 through the bonding wire WA.

In each of the six switching elements SW, the source electrode 3s of the semiconductor chip 1 is electrically connected to the drain electrode 4d (see FIG. 6) of the semiconductor chip 2 (MOSFET 4) through the bonding wire WA and the insulating plate 82. Also, in each of the six switching elements SW, the gate electrode 4g of the semiconductor chip 2 is electrically connected to the pad 4gp formed on the wiring board 81 through the bonding wire WA.

The drain electrode 3d (see FIG. 4) of the semiconductor chip 1 included in each of the three switching elements SW1 on the high side is electrically connected to the terminal 74. The drain electrode 3*d* (see FIG. 4) of the semiconductor chip 1 included in the switching element SW2 at the U phase on the low side is electrically connected to the terminal 73. The drain electrode 3*d* (see FIG. 4) of the semiconductor chip 1 included in the switching element SW2 at the V phase on the low side is electrically connected to the terminal 72. The drain electrode 3*d* (see FIG. 4) of the semiconductor chip 1 included in the switching element SW2 at the W phase on the low side is electrically connected to the terminal 71.

The source electrode 4*s* of the semiconductor chip 2 included in the switching element SW1 at the U phase on the high side is electrically connected to the terminal 73 through the bonding wire WA. The source electrode 4*s* of the semiconductor chip 2 included in the switching element SW1 at the V phase on the high side is electrically connected to the terminal 72 through the bonding wire WA. The source electrode 4*s* of the semiconductor chip 2 included in the switching element SW1 at the W phase on the high side is electrically connected to the terminal 71 through the bonding wire WA.

The source electrode 4*s* of the semiconductor chip 2 included in the switching element SW2 at the U phase on the low side is electrically connected to the terminal 70 through the bonding wire WA. The source electrode 4*s* of the semiconductor chip 2 included in the switching element SW2 at the V phase on the low side is electrically connected to the terminal 69 through the bonding wire WA. The source electrode 4*s* of the semiconductor chip 2 included in the switching element SW2 at the W phase on the low side is electrically connected to the terminal 68 through the bonding wire WA.

As described above, by forming the intelligent power module from the inverter INV and the gate driver DRV, the inverter INV and the gate driver DRV can be integrated and the size reduction can be achieved.

Power Module

Figure 10:
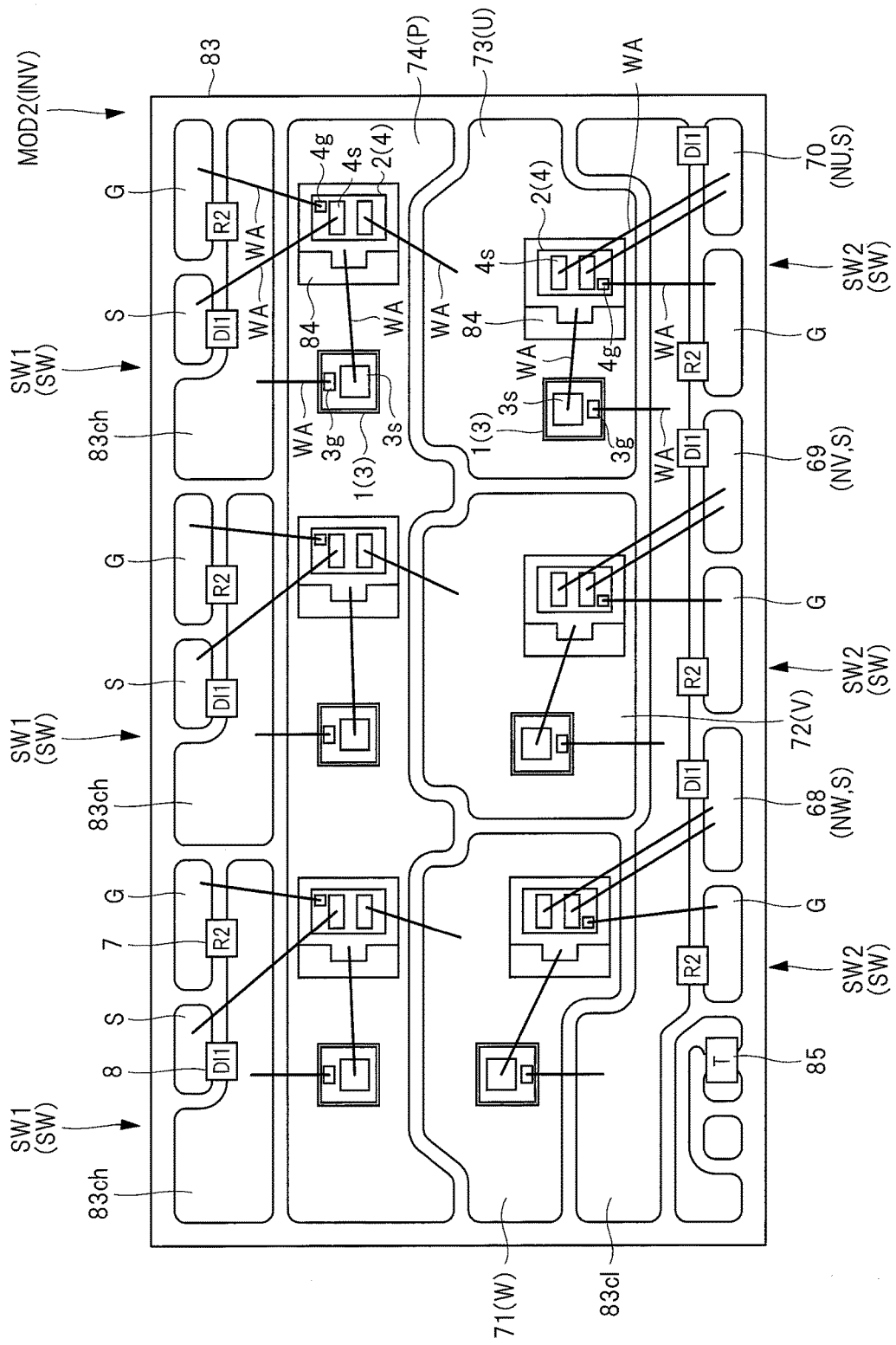
FIG. 10 is a top view schematically showing an example of a power module in which the semiconductor device of the first embodiment is used.
Figure 11:
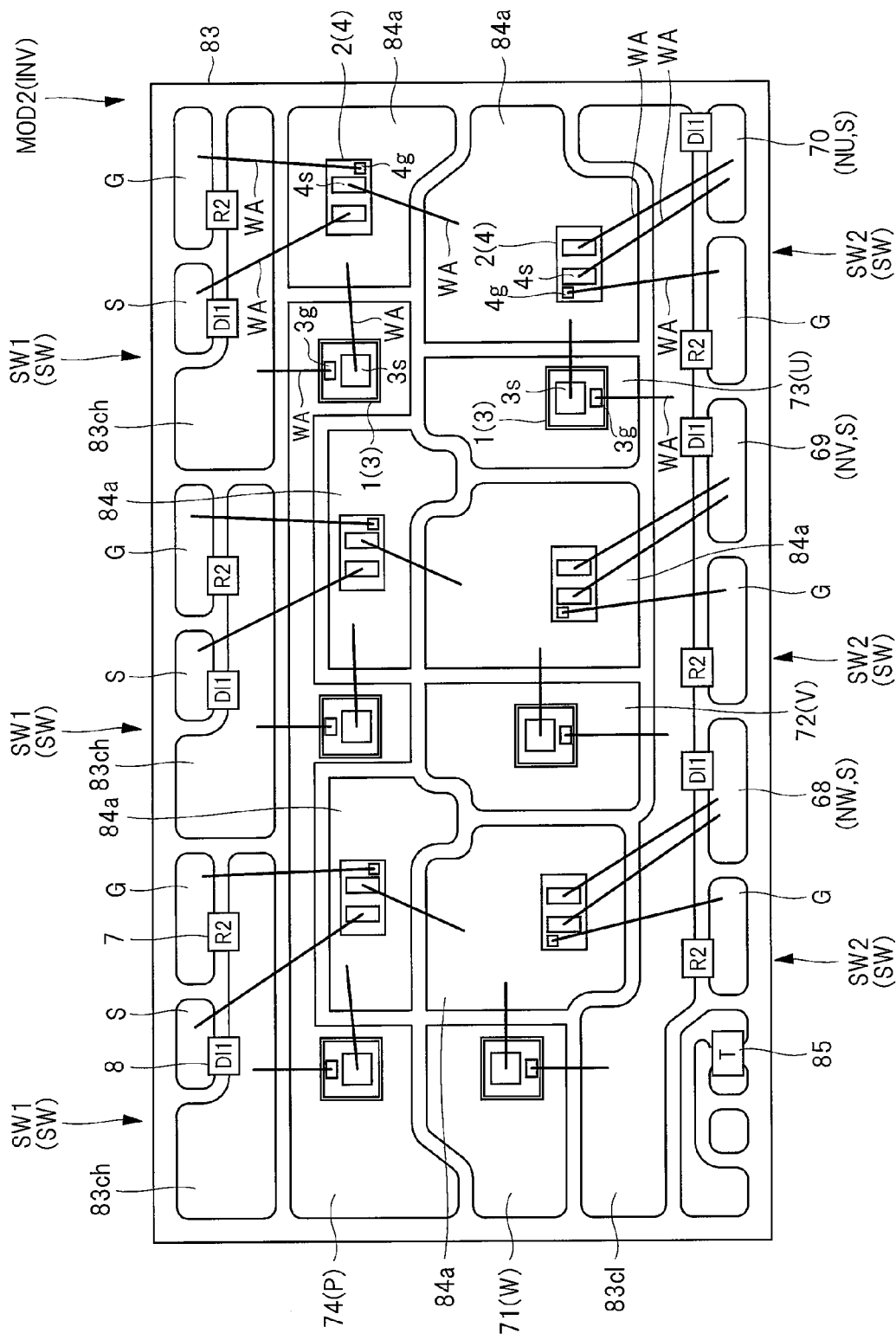
FIG. 11 is a top view schematically showing an example of a power module in which the semiconductor device of the first embodiment is used.

Next, a power module in which the semiconductor device of the first embodiment is used will be described. FIG. 10 and FIG. 11 are top views schematically showing an example of a power module in which the semiconductor device of the first embodiment is used. Note that FIG. 10 and FIG. 11 show the state seen through a sealing resin.

The power module MOD2 in which the semiconductor device of the first embodiment is used is formed of the inverter INV shown in FIG. 7.

As shown in FIG. 10, the power module MOD2 has the inverter INV. The inverter INV includes the three switching elements SW1 on the high side and the three switching elements SW2 on the low side like the inverter INV shown in FIG. 7.

Further, the power module MOD2 has a wiring board 83 and an insulating plate 84 in addition to the inverter INV as shown in FIG. 10. The wiring board 83 has six terminals G serving as gate pads, six terminals S serving as source pads, terminals 68 to 74, three terminals 83*ch* serving as connection pads, and a terminal 83*cl* serving as a connection pad. Among the six terminals S, three terminals S correspond to the terminals 70, 69 and 68, respectively.

The terminal 74 is a terminal P to which the power source potential VDD of the inverter INV is input like the terminal 74 shown in FIG. 8. Also, the terminal 73 is a terminal U from which the U phase is output like the terminal 73 shown in FIG. 8, the terminal 72 is a terminal V from which the V phase is output like the terminal 72 shown in FIG. 8, and the terminal 71 is a terminal W from which the W phase is output like the terminal 71 shown in FIG. 8. The terminal 70 is a terminal NU at which the U phase is connected to the ground potential like the terminal 70 shown in FIG. 8, the terminal 69 is a terminal NV at which the V phase is connected to the ground potential like the terminal 69 shown in FIG. 8, and the terminal 68 is a terminal NW at which the W phase is connected to the ground potential like the terminal 68 shown in FIG. 8.

The semiconductor chip 1 (junction FET 3) included in each of the three switching elements SW1 on the high side is mounted on the terminal 74, and the semiconductor chip 2 (MOSFET 4) included in each of the three switching elements SW1 on the high side is mounted on the terminal 74 via the insulating plate 84.

The semiconductor chip 1 included in the switching element SW2 at the U phase on the low side is mounted on the terminal 73, and the semiconductor chip 2 included in the switching element SW2 at the U phase on the low side is mounted on the terminal 73 via the insulating plate 84. The semiconductor chip 1 included in the switching element SW2 at the V phase on the low side is mounted on the terminal 72, and the semiconductor chip 2 included in the switching element SW2 at the V phase on the low side is mounted on the terminal 72 via the insulating plate 84. The semiconductor chip 1 included in the switching element SW2 at the W phase on the low side is mounted on the terminal 71, and the semiconductor chip 2 included in the switching element SW2 at the W phase on the low side is mounted on the terminal 71 via the insulating plate 84.

In each of the three switching elements SW1 on the high side, the gate electrode 3*g* of the semiconductor chip 1 (junction FET 3) is electrically connected to the terminal G through the bonding wire WA, the terminal 83*ch* and the resistor R2 (chip 7). Also, in each of the three switching elements SW1 on the high side, the gate electrode 3*g* of the semiconductor chip 1 is electrically connected to the terminal S through the bonding wire WA, the terminal 83*ch* and the diode DI1 (chip 8).

In each of the three switching elements SW2 on the low side, the gate electrode 3*g* of the semiconductor chip 1 (junction FET 3) is electrically connected to the terminal G through the bonding wire WA, the terminal 83*cl* and the resistor R2 (chip 7). Also, in each of the three switching elements SW2 on the low side, the gate electrode 3*g* of the semiconductor chip 1 is electrically connected to the terminal S through the bonding wire WA, the terminal 83*cl* and the diode DI1 (chip 8).

In each of the six switching elements SW, the source electrode 3*s* of the semiconductor chip 1 is electrically connected to the drain electrode 4*d* (see FIG. 6) of the semiconductor chip 2 (MOSFET 4) through the bonding wire WA and the insulating plate 84. Also, in each of the six switching elements SW, the gate electrode 4*g* of the semiconductor chip 2 is electrically connected to the terminal G through the bonding wire WA.

The drain electrode 3*d* (see FIG. 4) of the semiconductor chip 1 included in each of the three switching elements SW1 on the high side is electrically connected to the terminal 74. The drain electrode 3*d* (see FIG. 4) of the semiconductor chip 1 included in the switching element SW2 at the U phase on the low side is electrically connected to the terminal 73. The drain electrode 3*d* (see FIG. 4) of the semiconductor chip 1 included in the switching element SW2 at the V phase on the low side is electrically connected to the terminal 72. The drain electrode 3*d* (see FIG. 4) of the semiconductor chip 1 included in the switching element SW2 at the W phase on the low side is electrically connected to the terminal 71.

The source electrode 4s of the semiconductor chip 2 included in each of the three switching elements SW1 on the high side is electrically connected to the terminal S through the bonding wire WA. The source electrode 4s of the semiconductor chip 2 included in the switching element SW2 at the U phase on the low side is electrically connected to the terminal 70 through the bonding wire WA. The source electrode 4s of the semiconductor chip 2 included in the switching element SW2 at the V phase on the low side is electrically connected to the terminal 69 through the bonding wire WA. The source electrode 4s of the semiconductor chip 2 included in the switching element SW2 at the W phase on the low side is electrically connected to the terminal 68 through the bonding wire WA.

As described above, by forming the power module from the inverter INV, the inverter INV can be integrated and the size reduction can be achieved.

Note that, as shown in FIG. 11, three terminals 84a which are electrically insulated from the terminal 74 and on which the semiconductor chip 2 of each of the three switching elements SW1 on the high side is mounted may be provided instead of the insulating plate 84 (see FIG. 10). In addition, three terminals 84a which are electrically insulated from the terminals 73, 72 and 71 and on which the semiconductor chip 2 of each of the three switching elements SW2 on the low side is mounted may be provided instead of the insulating plate 84 (see FIG. 10).

Furthermore, as shown in FIG. 10 and FIG. 11, a thermistor 85 may be provided on the wiring board 83.

On-Resistance of Junction FET

Figure 12:
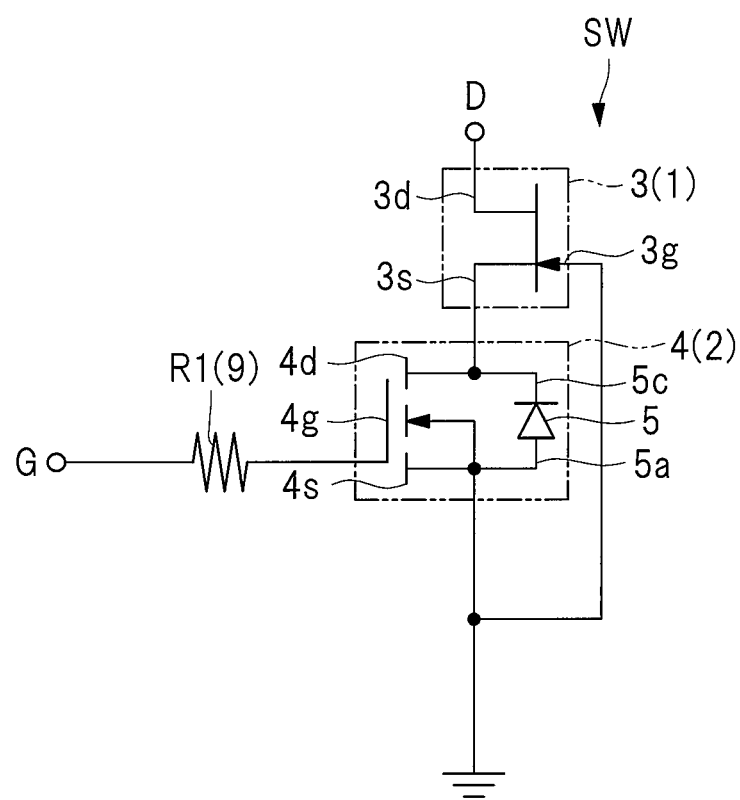
FIG. 12 is a circuit diagram of a configuration of a semiconductor device of a comparative example.
Figure 13:
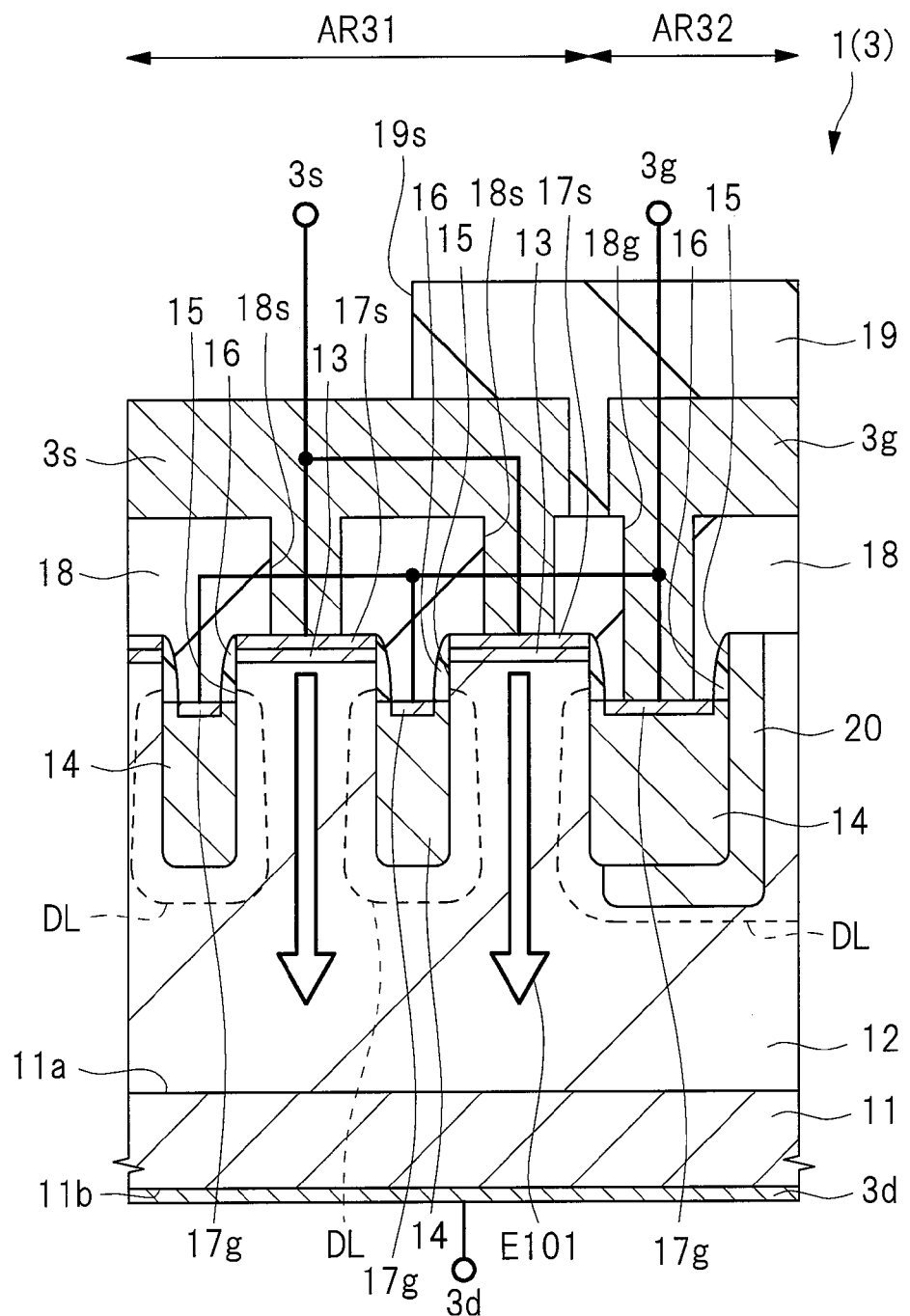
FIG. 13 is a cross-sectional view showing a principal part of a configuration of a semiconductor chip in which a junction FET is formed in the comparative example.

Next, the on-resistance of the junction FET in the first embodiment will be described while comparing with a semiconductor device of a comparative example. FIG. 12 is a circuit diagram of a configuration of the semiconductor device of the comparative example. FIG. 13 is a cross-sectional view showing a principal part of a configuration of a semiconductor chip in which a junction FET is formed in the comparative example. Note that the configuration of the semiconductor chip in the comparative example shown in FIG. 13 is the same as the configuration of the semiconductor chip in the first embodiment shown in FIG. 4. Also, the flow of electrons in the junction FET 3 when the switching element is in an on-state is indicated by arrows E101 in FIG. 13.

As shown in FIG. 12, the semiconductor device of the comparative example also has the semiconductor chip 1, the semiconductor chip 2, the terminal G and the terminal D like the semiconductor device of the first embodiment. The normally-on junction FET 3 is formed in the semiconductor chip 1, and the normally-off MOSFET 4 is formed in the semiconductor chip 2. Also in the semiconductor device of the comparative example, the junction FET 3 and the MOSFET 4 are connected in series between the terminal D and the ground potential like the semiconductor device of the first embodiment. Namely, the semiconductor device of the comparative example also has the junction FET 3 and the MOSFET 4 in cascode connection between the terminal D and the ground potential like the semiconductor device of the first embodiment.

On the other hand, in the first comparative example, the gate electrode 3g of the junction FET 3 is not electrically connected to the gate electrode 4g of the MOSFET 4 and is electrically connected to the source electrode 4s of the MOSFET 4 unlike in the first embodiment. Also, in the example shown in FIG. 12, the gate electrode 3g of the junction FET 3 is grounded.

In such a case, when the switching element is in an on-state, the potential of the gate electrode 3g of the junction FET 3 is the ground potential, that is, 0 V. Since the junction FET 3 is a normally-on junction FET, it is in an on-state when the voltage applied to the gate electrode 3g is 0 V. Also, when the junction FET 3 is in an on-state, electrons as charge carriers flow in the junction FET 3 from the n$^+$ type source layer 13 to the n$^+$ type semiconductor substrate 11 as the drain region through a part of the n$^-$ type drift layer 12 located between the adjacent p type gate layers 14 as indicated by the arrow E101.

However, when the voltage applied to the gate electrode 3g is 0 V, a depletion layer DL is likely to be formed in the part of the n$^-$ type drift layer 12 adjacent to the p type gate layer 14 in the junction FET 3 as shown in FIG. 13. Accordingly, a width of the part of the n$^-$ type drift layer 12 which is located between the adjacent p type gate layers 14 in the direction (second direction) crossing the extending direction (first direction) of the p type gate layer 14, preferably orthogonal thereto when seen in a plan view and through which the electrons can flow, that is, a so-called effective source width is narrowed, and the on-resistance of the junction FET 3 is increased.

An interval between the adjacent two p type gate layers 14 may be widened in order to reduce the on-resistance described above. However, when the interval between the adjacent two p type gate layers 14 is widened, the withstand voltage of the junction FET 3 is decreased. Thus, it is difficult to achieve both of the improvement of the withstand voltage and the reduction of the on-resistance in the junction FET 3 included in the semiconductor device of the comparative example.

As described above, the semiconductor device of the comparative example has the junction FET and the MOSFET 4 in cascode connection between the terminal D and the ground potential like the semiconductor device of the first embodiment. Therefore, when the on-resistance of the junction FET 3 in cascode connection with the MOSFET 4 is increased, the overall on-resistance of the semiconductor device is increased.

Also in the comparative example, the MOSFET 4 includes the semiconductor region made of Si and the junction FET 3 includes the semiconductor region made of, for example, SiC which is semiconductor with a band gap larger than that of Si like in the first embodiment. In such a case, the withstand voltage of the junction FET 3 is higher than the withstand voltage of the MOSFET 4. Specifically, the withstand voltage of the junction FET 3 is set to be about ten times as high as the withstand voltage of the MOSFET 4. Accordingly, when the withstand voltage of the junction FET 3 with the withstand voltage higher than the withstand voltage of the MOSFET 4 in the cascode-connected junction FET 3 and MOSFET 4 is decreased, the overall withstand voltage of the semiconductor device is decreased.

As described above, in the semiconductor device of the comparative example, the gate electrode 3g of the junction FET 3 is connected to the source electrode 4s of the MOSFET 4, and thus it is difficult to achieve both of the improvement of the withstand voltage and the reduction of the on-resistance.

Main Characteristics and Effect of Present Embodiment

On the other hand, in the semiconductor device of the first embodiment, the gate electrode 3g of the junction FET 3 is electrically connected to the gate electrode 4g of the MOSFET 4. Accordingly, when the MOSFET 4 is in an on-state, the potential of the gate electrode 3g of the junction FET 3 is not the ground potential, that is, 0 V, and a positive voltage is applied to the gate electrode 3g of the junction FET 3. At this time, as can be understood from the fact that the depletion layer DL (see FIG. 13) is not shown in FIG. 4, the depletion layer DL is less likely to be formed in the part of the n⁻ type drift layer 12 adjacent to the p type gate layer 14 in the junction FET 3.

Accordingly, a width of the part of the n⁻ type drift layer 12 which is located between the adjacent p type gate layers 14 in the direction (second direction) crossing the extending direction (first direction) of the p type gate layer 14, preferably orthogonal thereto when seen in a plan view and through which the electrons can flow, that is, a so-called effective source width is increased, and the on-resistance of the junction FET 3 is reduced. Therefore, since it is not necessary to widen the interval between the adjacent two p type gate layers 14 in order to reduce the on-resistance in the first embodiment, the withstand voltage of the junction FET 3 is less likely to be decreased. Consequently, it is possible to achieve both of the improvement of the withstand voltage and the reduction of the on-resistance in the junction FET 3 included in the semiconductor device of the first embodiment.

Also, in the semiconductor device of the first embodiment, the MOSFET 4 including the semiconductor region made of Si and the junction FET 3 including the semiconductor region made of SiC which is semiconductor with a band gap larger than that of Si are cascode-connected. Also, the junction FET 3 has the withstand voltage higher than that of the MOSFET 4. Therefore, in the first embodiment, it is possible to achieve both of the improvement of the withstand voltage of the semiconductor device and the reduction of the on-resistance of the semiconductor device by improving the withstand voltage of the junction FET 3 and reducing the on-resistance of the junction FET 3.

Here, when viewed from the other side, the fact that the source width for securing a certain amount of withstand voltage can be narrowed means that a predetermined withstand voltage can be secured even if the dimensional accuracy of the source width is not increased so much. Accordingly, it is possible to improve the yield in the manufacturing process and reduce the manufacturing cost of the semiconductor device.

Further, it is possible to increase the current density of the junction FET 3 by reducing the on-resistance. Accordingly, it is possible to reduce the chip size (chip area) for securing the desired current amount, and the size reduction of the semiconductor device can be achieved. In addition, as a result of the reduction of the chip size, the number of chips manufactured by dividing one wafer is increased, so that the manufacturing cost of the semiconductor device can be reduced.

Furthermore, by reducing the manufacturing cost of the semiconductor device as described above, the originally-possessed advantage in the manufacturing cost can be enhanced when the junction FET and the MOSFET in cascode connection are used as the semiconductor device in comparison with the case in which other power transistors such as IGBT are used as the semiconductor device.

Preferably, the gate electrode 3g of the junction FET 3 is electrically connected to the gate electrode 4g of the MOSFET 4 through the voltage control element 6. More preferably, the voltage control element 6 includes, for example, the resistor R2 and the diode DI1, and the gate electrode 3g of the junction FET 3 is electrically connected to the gate electrode 4g of the MOSFET 4 through the resistor R2 and is grounded through the diode DI1, or is electrically connected to the source electrode 4s of the MOSFET 4.

Thus, when a positive voltage of, for example, about 15 V is applied to bring the MOSFET 4 into an on-state, a constant voltage equal to the internal potential of the diode DI1 is applied to the gate electrode 3g of the junction FET 3. Accordingly, the stable control of the on-resistance of the junction FET 3 can be achieved in addition to the reduction of the on-resistance of the junction FET 3.

For example, when the diode DI1 has the pn junction made of silicon and the voltage of about 0.6 to 0.7 V is applied to the gate electrode 3g of the junction FET 3 as described above, the on-resistance of the junction FET 3 can be reduced by about 30% in comparison with the case in which the voltage of about 0 V is applied to the gate electrode 3g of the junction FET 3.

First Modification Example of Semiconductor Device

In the semiconductor device of the first embodiment, the voltage control element 6 includes the resistor R2 and the diode DI1, and the gate electrode 3g of the junction FET 3 is grounded through the diode DI1 or is electrically connected to the source electrode 4s of the MOSFET 4. Meanwhile, the voltage control element 6 may include only the resistor R2 but not include the diode DI1. The case like this will be described as the semiconductor device of the first modification example of the first embodiment. Note that the differences from the semiconductor device of the first embodiment will be mainly described below.

Figure 14:
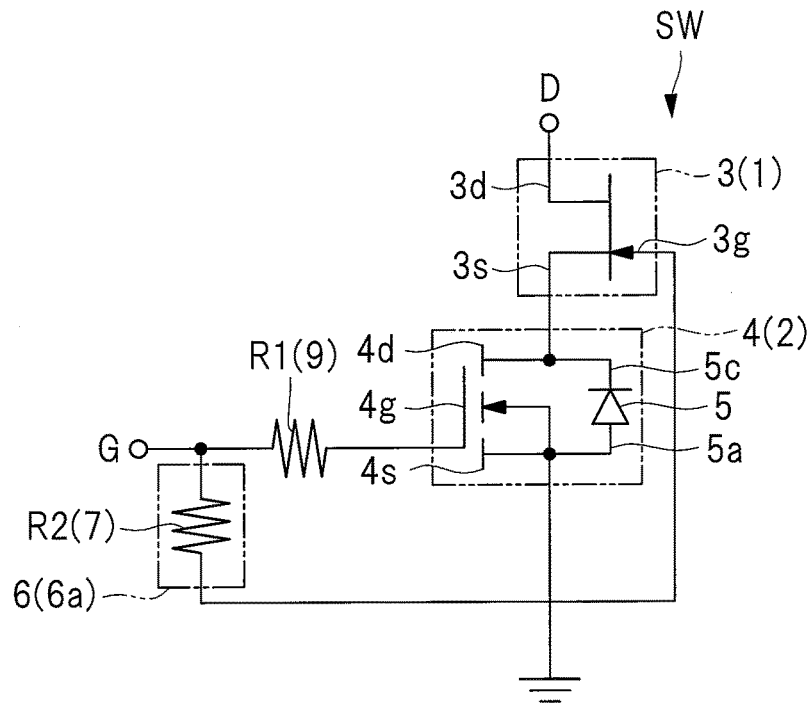
FIG. 14 is a circuit diagram of a configuration of a semiconductor device of a first modification example of the first embodiment.

FIG. 14 is a circuit diagram of a configuration of the semiconductor device of the first modification example of the first embodiment.

As shown in FIG. 14, for example, the voltage control element 6, that is, the voltage applying unit 6a includes the resistor R2 but does not include the diode DI1 (see FIG. 1). The gate electrode 3g of the junction FET 3 is electrically connected to the terminal G through the resistor R2. Namely, the gate electrode 3g of the junction FET 3 is electrically connected to the gate electrode 4g of the MOSFET 4 through the resistor R2.

In such a case, when a positive voltage of, for example, about 15 V is applied to the terminal G, that is, the gate electrode 4g of the MOSFET 4 to bring the MOSFET 4 into an on-state, the voltage approximately equal to the voltage applied to the gate electrode 4g of the MOSFET 4, that is, the positive voltage is applied to the gate electrode 3g of the junction FET 3. Also in this case, the depletion layer DL (see FIG. 13) is not formed in the part of the n⁻ type drift layer 12 adjacent to the p type gate layer 14 in the junction FET 3 as shown in FIG. 4. Accordingly, also in the first modification example, it is not necessary to widen the interval between the two adjacent p type gate layers 14 in order to reduce the on-resistance, and thus the withstand voltage of the junction FET 3 is not decreased like in the first embodiment. Therefore, it is possible to achieve both of the improvement of the withstand voltage and the reduction of the on-resistance also in the semiconductor device of the first modification example like the semiconductor device of the first embodiment.

Also, since the voltage control element 6 includes the resistor R2 but does not include the diode DI1 (see FIG. 1)

in the first modification example, the configuration of the voltage control element 6 can be simplified in comparison with the first embodiment.

Note that, since the voltage applied to the gate electrode 3g of the junction FET 3 becomes higher in the first modification example in comparison with the first embodiment, there is fear that the voltage is applied in the forward direction to the pn diode formed of the p type gate layer 14 and the n⁻ type drift layer 12 and the pn diode is brought into an on-state. Therefore, the semiconductor device of the first embodiment is more preferable in comparison with the semiconductor device of the first modification example in that there is no fear that the pn diode is brought into an on-state and there is no fear of the conduction deterioration due to the stacking fault in SiC or the like.

Second Modification Example of Semiconductor Device of First Embodiment

In the semiconductor device of the first embodiment, the gate electrode 3g of the junction FET 3 is electrically connected to the gate electrode 4g of the MOSFET 4. Meanwhile, it is only required to apply a voltage with a polarity opposite to that of the voltage applied to the gate electrode 3g of the junction FET 3 to bring the junction FET 3 into an off-state, to the gate electrode 3g of the junction FET 3 when the MOSFET 4 is in an on-state. The case like this will be described as the semiconductor device of the second modification example of the first embodiment. Note that the differences from the semiconductor device of the first embodiment will be mainly described below.

Figure 15:
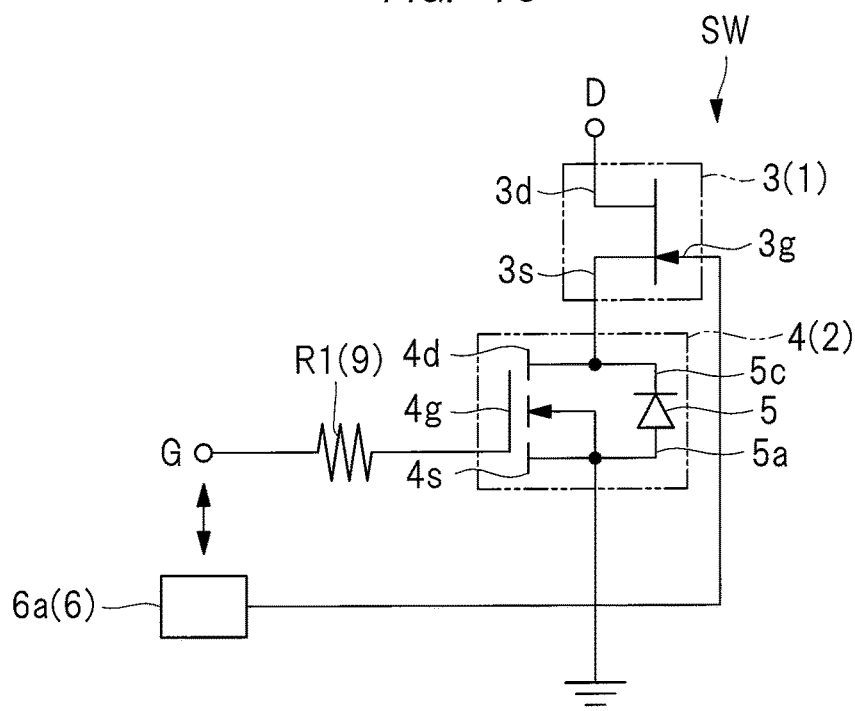
FIG. 15 is a circuit diagram of a configuration of a semiconductor device of a second modification example of the first embodiment.

FIG. 15 is a circuit diagram of a configuration of the semiconductor device of the second modification example of the first embodiment.

As shown in FIG. 15, the voltage control element 6 does not have to be electrically connected to the terminal G, that is, the gate electrode 4g of the MOSFET 4, and may be connected to, for example, a terminal which is not directly electrically connected to the terminal G.

In addition, in this second modification example, the voltage control element 6 is the voltage applying unit 6a which applies the voltage to the gate electrode 3g of the junction FET 3. The voltage applying unit 6a applies a voltage with a polarity opposite to that of the voltage applied to the gate electrode 3g of the junction FET 3 to bring the junction FET 3 into an off-state, to the gate electrode 3g of the junction FET 3 when the MOSFET 4 is in an on-state. In other words, the voltage applying unit 6a applies a voltage with a polarity opposite to that of the voltage applied to the gate electrode 3g of the junction FET 3 when the junction FET 3 is brought into an off-state, to the gate electrode 3g of the junction FET 3 when the MOSFET 4 is in an on-state. When the junction FET 3 is of an n channel type like the semiconductor device of the first embodiment, the polarity of the voltage applied to the gate electrode 3g of the junction FET when the junction FET 3 is brought into an off-state is negative.

Examples of the voltage control element 6 as the voltage applying unit 6a described above include a voltage applying circuit which applies a voltage with the same polarity as that of the voltage applied to the gate electrode 4g of the MOSFET 4, to the gate electrode 3g of the junction FET 3 in synchronization with, for example, the voltage applied to the terminal G when the MOSFET 4 is in an on-state. A variety of voltage applying circuits and voltage control elements can also be used other than that.

Also in the second modification example, the depletion layer DL (see FIG. 13) is not formed in the part of the n⁻ type drift layer 12 adjacent to the p type gate layer 14 when the junction FET 3 is in an on-state like in the first embodiment. Accordingly, it is not necessary to widen the interval between the two adjacent p type gate layers 14 in order to reduce the on-resistance of the junction FET 3, and thus the withstand voltage of the junction FET 3 is not decreased. Therefore, it is possible to achieve both of the improvement of the withstand voltage and the reduction of the on-resistance also in the semiconductor device of the second modification example like the semiconductor device of the first embodiment.

Second Embodiment

In the semiconductor device of the first embodiment, the voltage control element 6 includes one diode and the gate electrode 3g of the junction FET 3 is grounded through the diode or electrically connected to the source electrode 4s of the MOSFET 4. Meanwhile, the voltage control element 6 may include two diodes. The case like this will be described as the semiconductor device of the second embodiment. Note that the differences from the semiconductor device of the first embodiment will be mainly described below.

Figure 16:
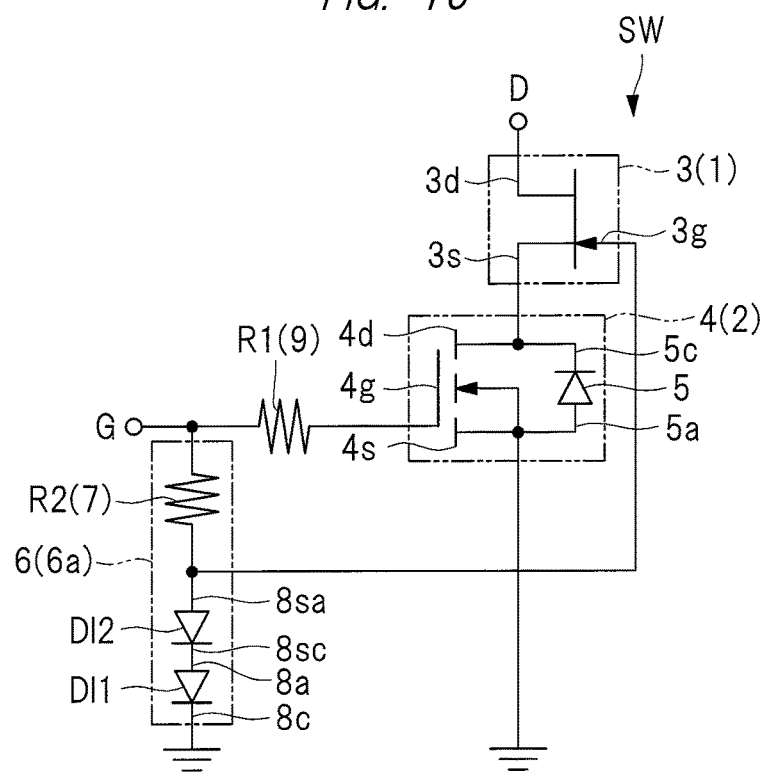
FIG. 16 is a circuit diagram of a configuration of a semiconductor device of the second embodiment.

FIG. 16 is a circuit diagram of a configuration of the semiconductor device of the second embodiment.

As shown in FIG. 16, the voltage control element 6 includes, for example, the resistor R2, the diode DI1 and a diode DI2. The gate electrode 3g of the junction FET 3 is electrically connected to the terminal G through the resistor R2. Namely, the gate electrode 3g of the junction FET 3 is electrically connected to the gate electrode 4g of the MOSFET 4 through the resistor R2.

An anode 8a of the diode DI1 is electrically connected to one end of the resistor R2 on the side of the gate electrode 3g through the diode DI2, and an anode 8sa of the diode DI2 is electrically connected to one end of the resistor R2 on the side of the gate electrode 3g. A cathode 8sc of the diode DI2 is electrically connected to the anode 8a of the diode DI1, and a cathode 8c of the diode DI1 is grounded. Namely, a plurality of diodes including the diodes DI1 and DI2 are connected in series between the one end of the resistor R2 on the side of the gate electrode 3g and the ground potential. The diode DI2 has a pn junction made of, for example, a p type silicon and an n type silicon like the diode DI1.

Note that a cathode 8c of the diode DI1 does not have to be grounded or may be electrically connected to the source electrode 4s of the MOSFET 4 as described above with reference to FIG. 1 and FIG. 2.

In the second embodiment, when a positive voltage of, for example, about 15 V is applied to bring the MOSFET 4 into an on-state, a constant voltage twice as high as the internal potential of the diode DI1 is applied to the gate electrode 3g of the junction FET 3. Namely, a constant voltage of about 1.2 to 1.4 V is applied to the gate electrode 3g of the junction FET 3. Accordingly, in the second embodiment, the on-resistance of the junction FET 3 can be made lower than the on-resistance of the junction FET 3 in the first embodiment, and the stable control thereof can be achieved.

Namely, in the second embodiment, the depletion layer DL (see FIG. 13) is less likely to be formed in the part of the n⁻ type drift layer 12 adjacent to the p type gate layer 14 when the junction FET 3 is in an on-state in comparison with the first embodiment. Therefore, it is not necessary to widen the interval between the two adjacent p type gate layers 14 in order to reduce the on-resistance of the junction FET 3, and thus the withstand voltage of the junction FET 3 is much less likely to be decreased. Accordingly, it is possible to achieve both of the further improvement of the withstand voltage and the further reduction of the on-resistance in the semiconductor device of the second embodiment in comparison with the semiconductor device of the first embodiment.

Also in the second embodiment, when the MOSFET 4 is in an off-state, for example, by applying the voltage of 0 V to the gate electrode 4g of the MOSFET 4, the voltage of 0 V is applied also to the gate electrode 3g of the junction FET 3 like in the first embodiment.

Also, the number of diodes included in the voltage control element 6 is not limited to two. Namely, the number of diodes connected in series between one end of the resistor R2 on the side of the gate electrode 3g and the ground potential may be three or more. By adjusting the number of diodes connected in series between one end of the resistor R2 on the side of the gate electrode 3g and the ground potential, the voltage applied to the gate electrode 3g of the junction FET 3 when the MOSFET 4 is brought into an on-state can be freely adjusted to be several times as high as the internal potential.

Third Embodiment

In the semiconductor device of the first embodiment, the semiconductor device includes the chip 7 and the chip 8, and the chip 7 includes the resistor R2 and the chip 8 includes the diode DI1. Meanwhile, the semiconductor chip 2 including the MOSFET 4 may include the resistor R2 and the diode DI1. Namely, the MOSFET 4, the resistor R2 and the diode DI1 may be formed in the same semiconductor chip 2. The case like this will be described as the semiconductor device of the third embodiment. Note that the differences from the semiconductor device of the first embodiment will be mainly described below.

Circuit Configuration of Semiconductor Device

Figure 17:
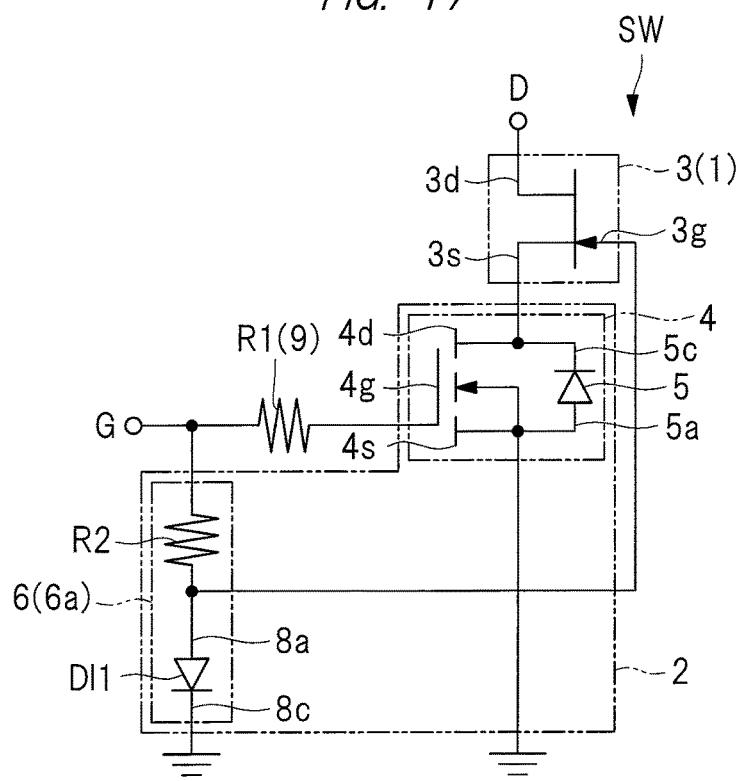
FIG. 17 is a circuit diagram of a configuration of a semiconductor device of the third embodiment.

FIG. 17 is a circuit diagram of a configuration of a semiconductor device of the third embodiment.

As shown in FIG. 17, the semiconductor device of the third embodiment can be configured in the same manner as that of the first embodiment except that the MOSFET 4, the resistor R2 and the diode DI1 are formed in the same semiconductor chip 2. Accordingly, also in the third embodiment, the voltage control element 6 includes the resistor R2 and the diode DI1 like in the first embodiment. The gate electrode 3g of the junction FET 3 is electrically connected to the terminal G through the resistor R2. Namely, the gate electrode 3g of the junction FET 3 is electrically connected to the gate electrode 4g of the MOSFET 4 through the resistor R2.

Meanwhile, the semiconductor device of the third embodiment does not have the chip 7 (see FIG. 1) and the chip 8 (see FIG. 1) unlike the semiconductor device of the first embodiment. Then, the MOSFET 4, the resistor R2 and the diode DI1 are formed in the semiconductor chip 2. Accordingly, as described later with reference to FIG. 18 to FIG. 22, the number of parts to be mounted when assembling an intelligent power module or a power module can be reduced, and the manufacturing cost can be reduced. Further, the design of the arrangement of the terminals in the wiring board of the intelligent power module and the power module can be facilitated.

Configuration of Semiconductor Chip in Which MOSFET is Formed

Figure 18:
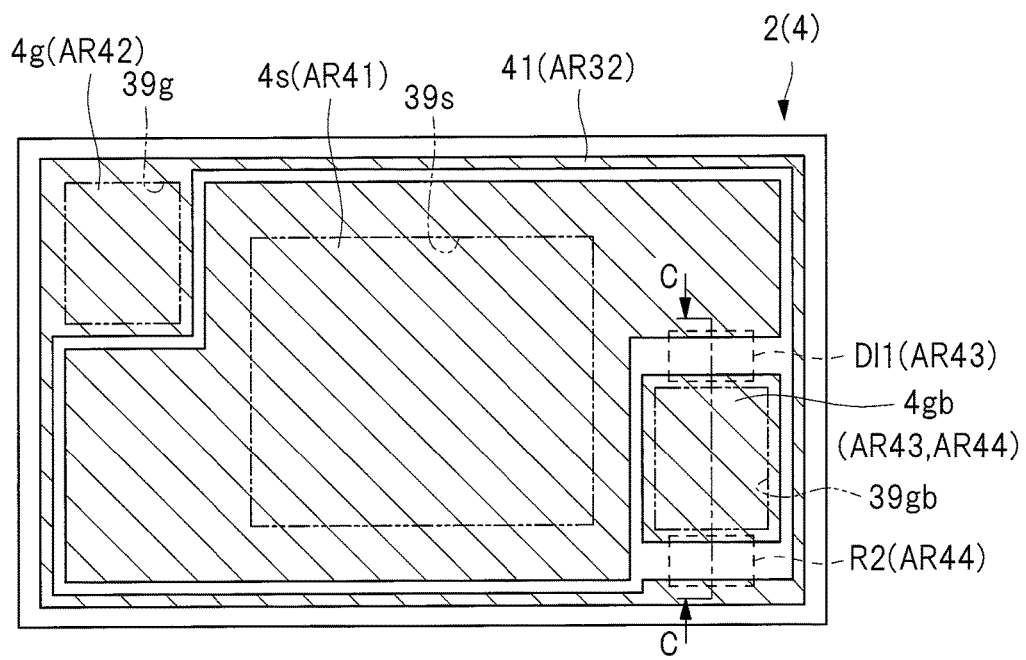
FIG. 18 is a plan view of a configuration of a semiconductor chip in which a MOSFET is formed in the third embodiment.
Figure 19:
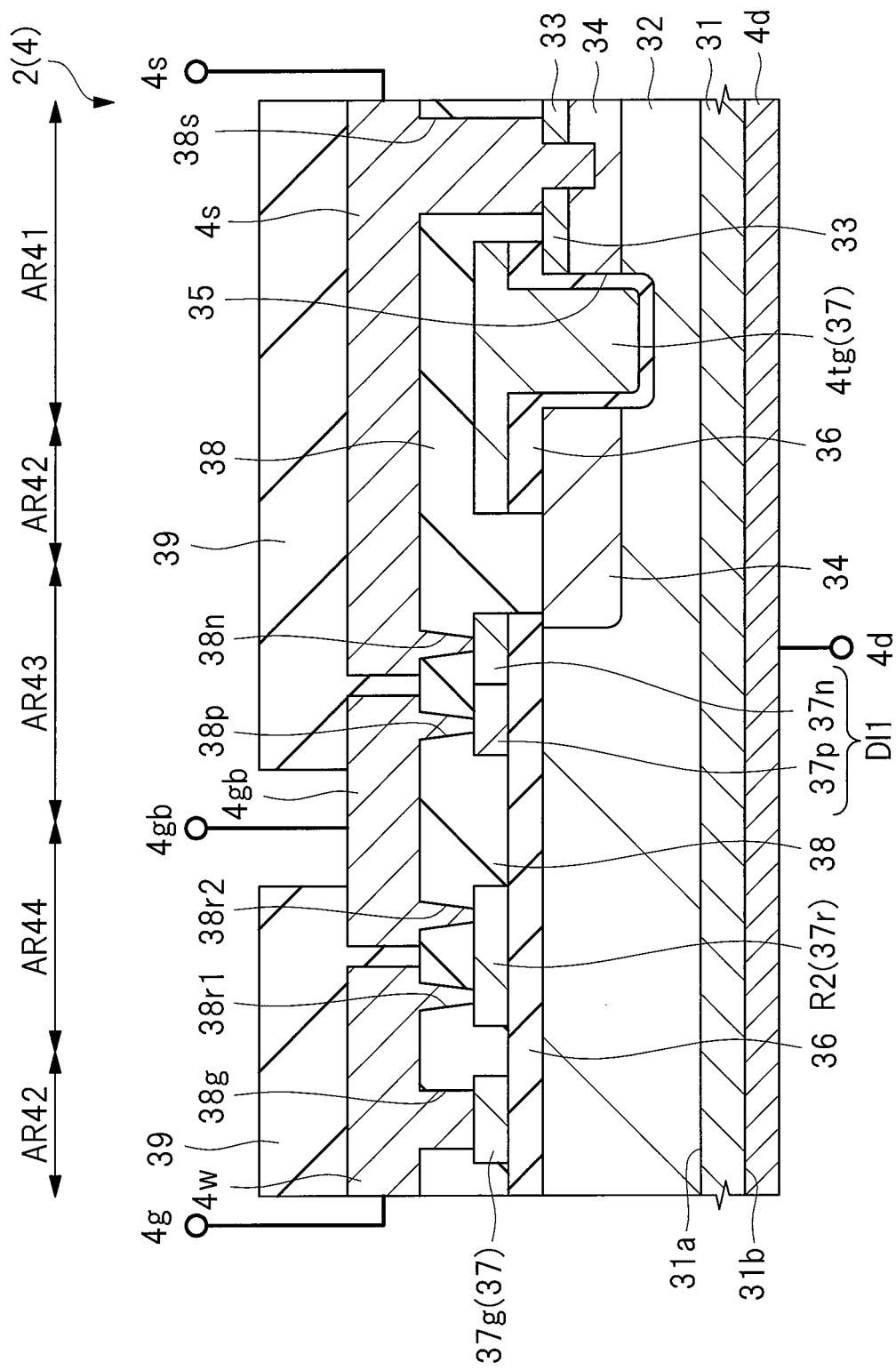
FIG. 19 is a cross-sectional view showing a principal part of the configuration of the semiconductor chip in which the MOSFET is formed in the third embodiment.

Next, the configuration of the semiconductor chip 2 in which the MOSFET 4 is formed will be described. FIG. 18 is a plan view of the configuration of the semiconductor chip in which the MOSFET is formed in the third embodiment. FIG. 19 is a cross-sectional view showing a principal part of the configuration of the semiconductor chip in which the MOSFET is formed in the third embodiment. FIG. 18 shows the state seen through a surface protection film 39 (see FIG. 19) for easy understanding. FIG. 19 is a cross-sectional view taken along the line C-C of FIG. 18. In the following description, a vertical MOSFET formed on a silicon (Si) substrate is taken as an example of the MOSFET 4, and the differences from the semiconductor chip 2 described in the first embodiment with reference to FIG. 5 and FIG. 6 will be mainly described.

The structure of the semiconductor chip 2 in the cell formation region AR41 in the third embodiment is the same as the structure of the semiconductor chip 2 in the cell formation region AR41 in the first embodiment described with reference to FIG. 5 and FIG. 6, and thus the description thereof is omitted.

Meanwhile, in the third embodiment, the $n^+$ type semiconductor substrate 31 has a diode formation region AR43 on the side of the main surface 31a and a resistor formation region AR44 on the side of the main surface 31a in addition to the cell formation region AR41 on the side of the main surface 31a and the peripheral region AR42 on the side of the main surface 31a. The diode formation region AR43 is a region in which the diode DI1 is formed, and the resistor formation region AR44 is a region in which the resistor R2 is formed. The diode formation region AR43 and the resistor formation region AR44 are disposed on the peripheral side of the $n^+$ type semiconductor substrate 31 relative to the cell formation region AR41, and are disposed so as to be surrounded by, for example, the peripheral region AR42.

In the diode formation region AR43 and the resistor formation region AR44, the $n^-$ type drift layer 32 with an impurity concentration lower than that of the $n^+$ type semiconductor substrate 31 is formed on the main surface 31a of the $n^+$ type semiconductor substrate 31 like the peripheral region AR42. The insulating film 36 is formed on the $n^-$ type drift layer 32.

In the diode formation region AR43, a p type semiconductor region 37p made of, for example, a polycrystalline silicon film to which a p type impurity is introduced by ion implantation and an n type semiconductor region 37n made of, for example, a polycrystalline silicon film to which an n type impurity is introduced by ion implantation are formed on the insulating film 36 so as to be adjacent to each other. The diode DI1 is formed of the p type semiconductor region 37p and the n type semiconductor region 37n. Also, in the resistor formation region AR44, a resistor film 37r made of, for example, a polycrystalline silicon film to which an impurity is introduced by ion implantation is formed on the insulating film 36. The resistor R2 is formed of the resistor film 37r. Namely, the semiconductor chip 2 includes the resistor R2 formed on the $n^+$ type semiconductor substrate 31 and the diode DI1 formed on the $n^+$ type semiconductor substrate 31.

In the diode formation region AR43, the interlayer insulating film 38 is formed on the $n^-$ type drift layer 32 so as to cover the insulating film 36, the p type semiconductor region 37p and the n type semiconductor region 37n. In the resistor formation region AR44, the interlayer insulating film 38 is formed on the n⁻ type drift layer 32 so as to cover the insulating film 36 and the resistor film 37r.

In the diode formation region AR43, a contact hole 38p which passes through the interlayer insulating film 38 to reach the p type semiconductor region 37p and a contact hole 38n which passes through the interlayer insulating film 38 to reach the n type semiconductor region 37n are formed in the interlayer insulating film 38. In the resistor formation region AR44, contact holes 38r1 and 38r2 which pass through the interlayer insulating film 38 to reach the resistor film 37r are formed.

In the cell formation region AR41, the peripheral region AR42 and the diode formation region AR43, the source electrode 4s is formed in the contact holes 38s and 38n and on the interlayer insulating film 38. Further, the source electrode 4s is electrically connected to the n type semiconductor region 37n through the contact hole 38n.

In the diode formation region AR43 and the resistor formation region AR44, the gate bias electrode 4gb is formed in the contact holes 38p and 38r2 and on the interlayer insulating film 38. The resistor film 37r is electrically connected to the p type semiconductor region 37p through the contact hole 38r2, the gate bias electrode 4gb and the contact hole 38p. The gate bias electrode 4gb is made of a metal film in the same layer as the source electrode 3s, for example, a metal film containing aluminum as a main component.

In the peripheral region AR42 and the resistor formation region AR44, the guard ring wiring 4w is formed in the contact holes 38g and 38r1 and on the interlayer insulating film 38. The guard ring wiring 4w is electrically connected to the resistor film 37r through the contact hole 38r1.

In the cell formation region AR41, the peripheral region AR42, the diode formation region AR43 and the resistor formation region AR44, the surface protection film 39 is formed on the interlayer insulating film 38 so as to cover the source electrode 4s, the gate bias electrode 4gb and the guard ring wiring 4w. In the diode formation region AR43 and the resistor formation region AR44, an opening 39gb which passes through the surface protection film 39 to reach the gate bias electrode 4gb is formed in the surface protection film 39, and a gate bias pad is formed of the gate bias electrode 4gb exposed at the bottom of the opening 39gb.

With the configuration described above, the MOSFET 4, the resistor R2 and the diode DI1 can be formed in the same semiconductor chip 2.

Intelligent Power Module

Figure 20:
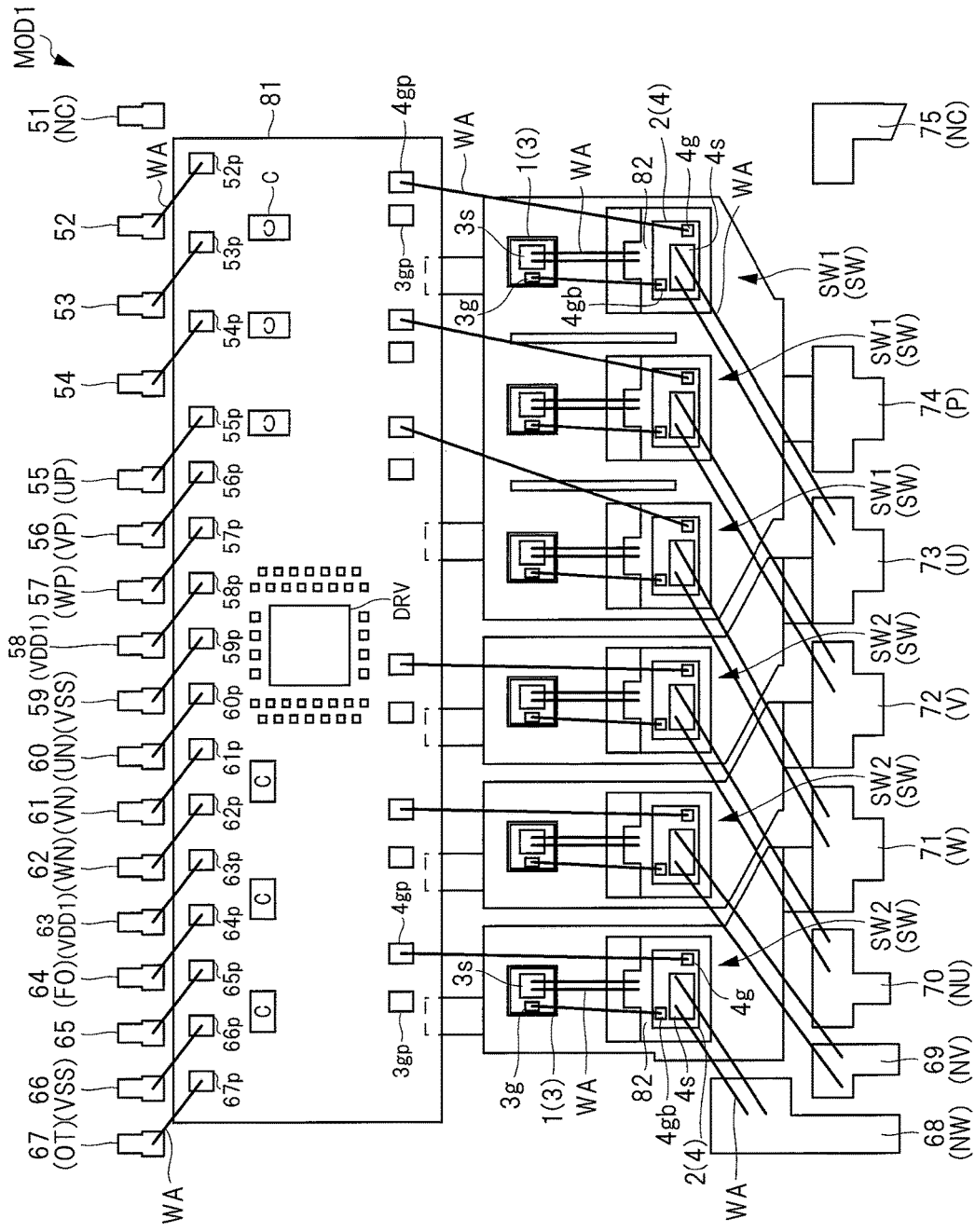
FIG. 20 is a top view schematically showing an example of an intelligent power module in which the semiconductor device of the third embodiment is used.

Next, an intelligent power module in which the semiconductor device of the third embodiment is used will be described. FIG. 20 is a top view schematically showing an example of the intelligent power module in which the semiconductor device of the third embodiment is used. FIG. 20 shows the state seen through a sealing resin. In the following description, the differences from the intelligent power module described in the first embodiment with reference to FIG. 9 will be mainly described.

In the third embodiment, the resistor R2 and the diode DI1 are formed in the semiconductor chip 2 as described with reference to FIG. 19. Therefore, as shown in FIG. 20, the chip 7 (see FIG. 9) including the resistor R2 and the chip 8 (see FIG. 9) including the diode DI1 are not mounted on the wiring board 81 in the intelligent power module MOD1 in the third embodiment unlike the intelligent power module MOD1 in the first embodiment described with reference to FIG. 9.

At this time, in each of the six switching elements SW, the gate electrode 3g of the semiconductor chip 1 (junction FET 3) is not connected to the pad 3gp formed on the wiring board 81, and is electrically connected to the gate bias electrode 4gb of the semiconductor chip 2 (MOSFET 4) through the bonding wire WA.

With the configuration described above, the number of parts to be mounted when assembling an intelligent power module can be reduced, and the manufacturing cost can be reduced. Further, the design of the arrangement of the terminals in the wiring board of the intelligent power module can be facilitated.

Note that FIG. 20 shows the example in which the chip 9 (see FIG. 9) including the resistor R1 in each switching element SW is also not mounted on the wiring board 81 for the reason that it is formed in the semiconductor chip 2 or the like.

Power Module

Figure 21:
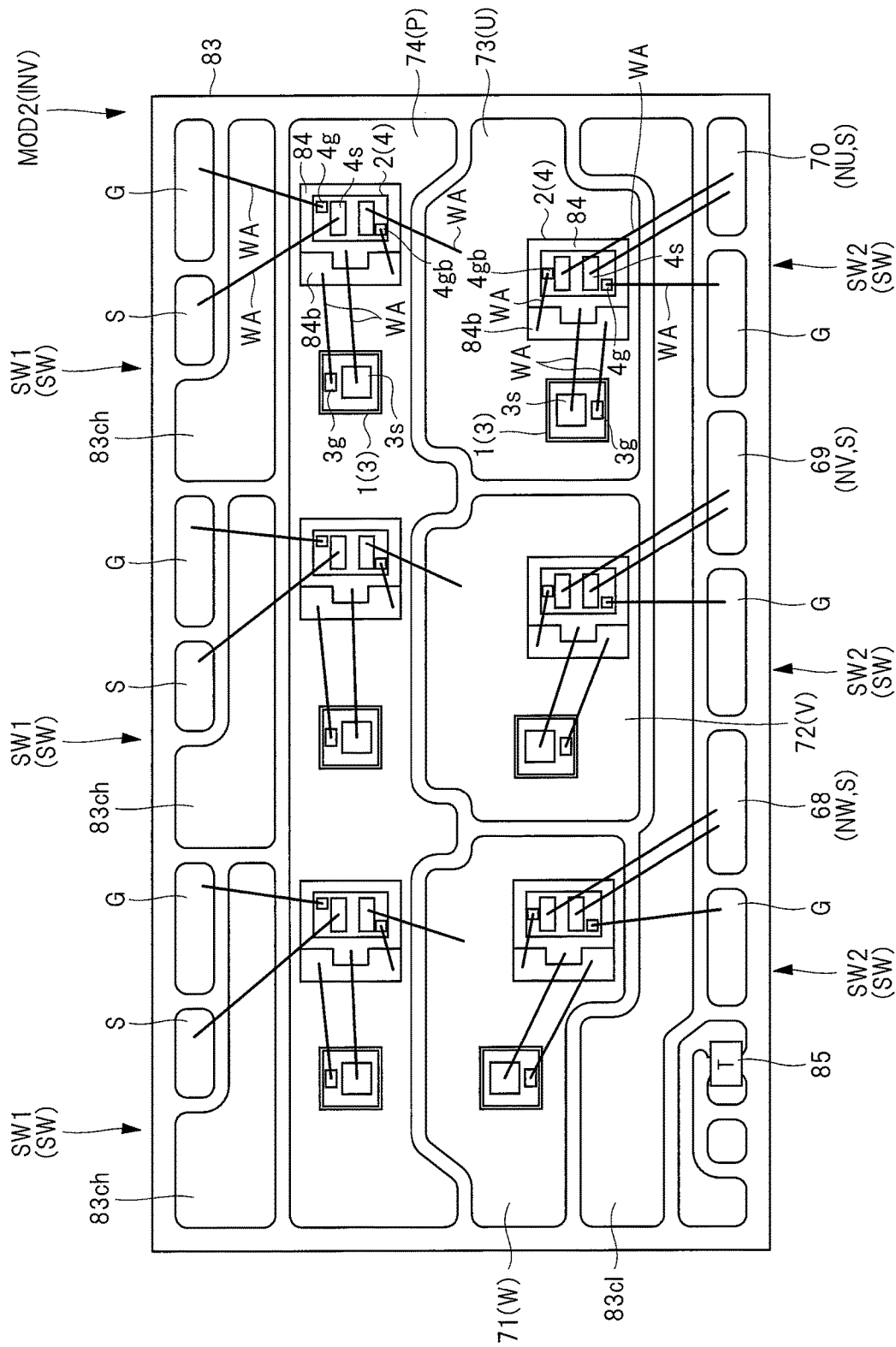
FIG. 21 is a top view schematically showing an example of a power module in which the semiconductor device of the third embodiment is used.
Figure 22:
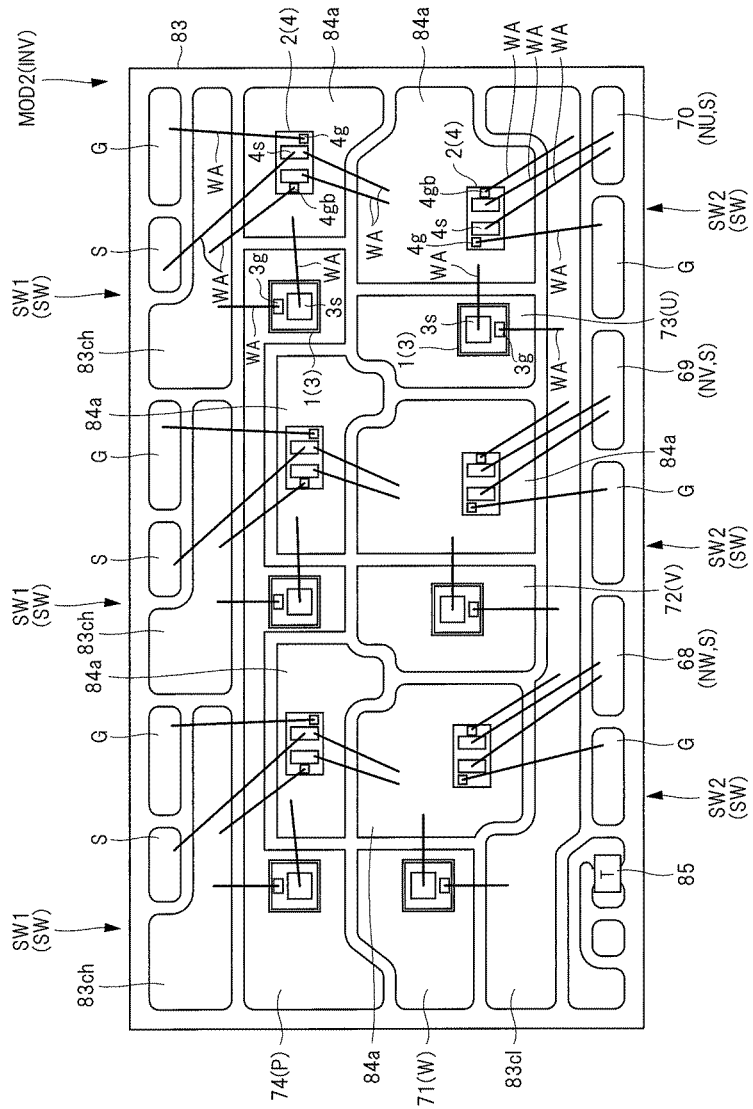
FIG. 22 is a top view schematically showing an example of a power module in which the semiconductor device of the third embodiment is used.

Next, a power module in which the semiconductor device of the third embodiment is used will be described. FIG. 21 and FIG. 22 are top views schematically showing an example of a power module in which the semiconductor device of the third embodiment is used. Note that FIG. 21 and FIG. 22 show the state seen through a sealing resin. Also, the differences from the power module described in the first embodiment with reference to FIG. 10 and FIG. 11 will be mainly described below.

In the third embodiment, the resistor R2 and the diode DI1 are formed in the semiconductor chip 2 as described with reference to FIG. 19. Thus, as shown in FIG. 21, the chip 7 (see FIG. 10) including the resistor R2 and the chip 8 (see FIG. 10) including the diode DI1 are not mounted on the wiring board 83 in the power module MOD2 in the third embodiment unlike the power module MOD2 in the first embodiment described with reference to FIG. 10.

At this time, in each of the three switching elements SW1 on the high side, the gate electrode 3g of the semiconductor chip 1 (junction FET 3) is not connected to the terminal 83ch, and is electrically connected to the gate bias electrode 4gb of the semiconductor chip 2 (MOSFET 4) through the bonding wire WA and an insulating plate 84b.

Also, in each of the three switching elements SW2 on the low side, the gate electrode 3g of the semiconductor chip 1 is not connected to the terminal 83cl, and is electrically connected to the gate bias electrode 4gb of the semiconductor chip 2 through the bonding wire WA and the insulating plate 84b.

With the configuration described above, the number of parts to be mounted when assembling a power module can be reduced, and the manufacturing cost can be reduced. Further, the design of the arrangement of the terminals in the wiring board of the power module can be facilitated.

Note that, as shown in FIG. 22, three terminals 84a which are electrically insulated from the terminal 74 and on which the semiconductor chip 2 of each of the three switching elements SW1 on the high side is mounted may be provided instead of the insulating plates 84 and 84b (see FIG. 21). In addition, three terminals 84a which are electrically insulated from the terminals 73, 72 and 71 and on which the semiconductor chip 2 of each of the three switching elements SW2 on the low side is mounted may be provided instead of the insulating plates 84 and 84b (see FIG. 21).

Main Characteristics and Effect of Present Embodiment

The semiconductor device of the third embodiment has the characteristics similar to those of the semiconductor device of the first embodiment, and thus exhibits the same effect as that of the semiconductor device of the first embodiment.

In addition, the MOSFET 4, the resistor R2 and the diode DI1 are formed in the same semiconductor chip in the semiconductor device of the third embodiment unlike the semiconductor device of the first embodiment. Accordingly, the number of parts to be mounted when assembling an intelligent power module or a power module can be reduced, and the manufacturing cost can be reduced. Further, the design of the arrangement of the terminals in the wiring board of the intelligent power module and the power module can be facilitated.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device, comprising:
a normally-on junction FET (Field-Effect Transistor) including a first gate electrode, a first source electrode and a first drain electrode;
a normally-off MOSFET (Metal-Oxide-Semiconductor Field-Effect Transistor) including a second gate electrode, a second source electrode and a second drain electrode; and
a voltage control element which controls a voltage applied to the first gate electrode,
wherein the first source electrode of the junction FET is electrically connected to the second drain electrode of the MOSFET, and the junction FET is thus connected to the MOSFET in series, and
the first gate electrode is electrically connected to the second gate electrode,
wherein the voltage control element includes a first diode,
a first anode of the first diode is electrically connected to the first gate electrode, and
a first cathode of the first diode is electrically connected to the second source electrode of the MOSFET.

2. The semiconductor device according to claim 1, wherein the first gate electrode is electrically connected to the second gate electrode through the voltage control element.

3. The semiconductor device according to claim 2, wherein the voltage control element includes a resistor, and
the first gate electrode is electrically connected to the second gate electrode through the resistor.

4. The semiconductor device according to claim 3, wherein:
the first anode of the first diode is electrically connected to one end of the resistor on a side of the first gate electrode, and
the first cathode of the first diode is electrically connected to the second source electrode of the MOSFET.

5. The semiconductor device according to claim 4, wherein the voltage control element includes a second diode,
the first anode is electrically connected to the one end of the resistor on the side of the first gate electrode through the second diode,
a second anode of the second diode is electrically connected to the one end of the resistor on the side of the first gate electrode, and a second cathode of the second diode is electrically connected to the first anode.

6. The semiconductor device according to claim 4, further comprising:
a first semiconductor chip,
wherein the first semiconductor chip include:
a first semiconductor substrate;
the MOSFET formed on the first semiconductor substrate;
the resistor formed on the first semiconductor substrate; and
the first diode formed on the first semiconductor substrate.

7. The semiconductor device according to claim 1, further comprising:
a plurality of switching elements,
wherein each of the plurality of switching elements has the junction FET and the MOSFET,
the plurality of switching elements constitute an inverter, and
a motor is driven by the inverter.

8. The semiconductor device according to claim 1,
wherein the junction FET includes a first semiconductor region made of silicon carbide, and
the MOSFET includes a second semiconductor region made of silicon.

9. The semiconductor device according to claim 1,
wherein the junction FET includes:
an n type second semiconductor substrate;
an n type drift layer formed on the second semiconductor substrate;
an n type source layer formed in an upper layer part of the drift layer;
a trench formed in a part of the drift layer adjacent to the source layer when seen in a plan view; and
a p type gate layer formed in a part of the drift layer exposed at a bottom of the trench, and
the MOSFET is of an n channel type.

10. A semiconductor device, comprising:
a normally-on transistor including a first control electrode, a first source electrode and a first drain electrode;
a normally-off transistor including a second control electrode, a second source electrode and a second drain electrode; and
a voltage control element which controls a voltage applied to the first control electrode,
wherein the first source electrode of the normally-on transistor is electrically connected to the second drain electrode of the normally-off transistor, and the normally-on transistor is thus connected to the normally-off transistor in series, and
the first control electrode is electrically connected to the second control electrode,
wherein the voltage control element includes a first diode,
a first anode of the first diode is electrically connected to the first control electrode, and
a first cathode of the first diode is electrically connected to the second source electrode of the normally-off transistor.

11. The semiconductor device according to claim 10, wherein the first control electrode is electrically connected to the second control electrode through the voltage control element.

12. The semiconductor device according to claim 11, wherein the voltage control element includes a resistor, and
the first control electrode is electrically connected to the second control electrode through the resistor.

13. The semiconductor device according to claim 12, wherein:
the first anode of the first diode is electrically connected to one end of the resistor on a side of the first control electrode, and
the first cathode of the first diode is electrically connected to the second source electrode of the normally-off transistor.

14. The semiconductor device according to claim 13, wherein the voltage control element includes a second diode,
the first anode is electrically connected to the one end of the resistor on the side of the first control electrode through the second diode,
a second anode of the second diode is electrically connected to the one end of the resistor on the side of the first control electrode, and
a second cathode of the second diode is electrically connected to the first anode.

15. The semiconductor device according to claim 13, further comprising:
a first semiconductor chip,
wherein the first semiconductor chip include:
a first semiconductor substrate;
the normally-off transistor formed on the first semiconductor substrate;
the resistor formed on the first semiconductor substrate; and
the first diode formed on the first semiconductor substrate.

16. The semiconductor device according to claim 10, further comprising:
a plurality of switching elements,
wherein each of the plurality of switching elements has the normally-on transistor and the normally-off transistor,
the plurality of switching elements constitute an inverter, and
a motor is driven by the inverter.

17. The semiconductor device according to claim 10, wherein the normally-on transistor includes a first semiconductor region made of silicon carbide, and
the normally-off transistor includes a second semiconductor region made of silicon.

18. The semiconductor device according to claim 10, wherein the normally-on transistor includes:
an n type second semiconductor substrate;
an n type drift layer formed on the second semiconductor substrate;
an n type source layer formed in an upper layer part of the drift layer;
a trench formed in a part of the drift layer adjacent to the source layer when seen in a plan view; and
a p type control layer formed in a part of the drift layer exposed at a bottom of the trench, and
the normally-off transistor is of an n channel type.

* * * * *

UNITED STATES PATENT AND TRADEMARK OFFICE
CERTIFICATE OF CORRECTION

PATENT NO.        : 9,837,395 B2
APPLICATION NO.   : 15/097128
DATED             : April 12, 2016
INVENTOR(S)       : Hisashi Toyoda et al.

It is certified that error appears in the above-identified patent and that said Letters Patent is hereby corrected as shown below:

On the Title Page

Item (73) should be corrected to read:
(73) Assignee: Renesas Electronics Corporation, Tokyo (JP)

Signed and Sealed this
Twenty-second Day of May, 2018

Andrei Iancu
*Director of the United States Patent and Trademark Office*